United States Patent
Baudot et al.

(10) Patent No.: US 12,238,898 B2
(45) Date of Patent: Feb. 25, 2025

(54) METHOD AND APPARATUS FOR MANAGING HEAT DISTRIBUTION IN A SEMICONDUCTOR DEVICE

(71) Applicant: CIENA CORPORATION, Hanover, MD (US)

(72) Inventors: Charles Baudot, Quebec (CA); Sean Sebastian O'Keefe, Dunrobin (CA); Francois Pelletier, Quebec (CA); Antoine Bois, Quebec (CA)

(73) Assignee: CIENA CORPORATION, Hanover, MD (US)

( * ) Notice: Subject to any disclaimer, the term of this patent is extended or adjusted under 35 U.S.C. 154(b) by 107 days.

(21) Appl. No.: 17/961,358

(22) Filed: Oct. 6, 2022

(65) Prior Publication Data
US 2024/0121919 A1   Apr. 11, 2024

(51) Int. Cl.
*G06F 1/16*   (2006.01)
*G06F 1/20*   (2006.01)
(Continued)

(52) U.S. Cl.
CPC ............. *H05K 7/205* (2013.01); *G06F 1/203* (2013.01); *H01L 23/3677* (2013.01); *H01L 23/5226* (2013.01)

(58) Field of Classification Search
CPC ............... H05K 7/205; H05K 7/20509; H05K 7/20518; H05K 7/20436; G06F 1/203;
(Continued)

(56) References Cited

U.S. PATENT DOCUMENTS 6,710,443 B1 *   3/2004   Rost .................... H01L 23/367
                                                        257/E23.102
8,117,582 B2   2/2012   Lee
(Continued)

OTHER PUBLICATIONS

"Multiple Patterning: A way to image IC designs at 20nm and below.", Semiconductor Engineering, https://semiengineering.com/knowledge_centers/manufacturing/patternin g/multipatterning/, Aug. 22, 2022, 7 Pages.
(Continued)

*Primary Examiner* — Anthony M Haughton
(74) *Attorney, Agent, or Firm* — Guntin & Gust, PLC; Robert Gingher

(57) ABSTRACT

Aspects of the subject disclosure may include, for example, a process that provides a semiconductor substrate and forms repeating, conductive patterns configured for coupling to active circuitry. Each pattern comprises a group of thermally conductive layers, wherein the group of thermally layers is thermally coupled to a thermal source generated by the active circuitry. Thermally conductive vias interconnect the group of thermally conductive layers, wherein a combination of the vias and the group of thermally conductive layers is configured to transfer heat from the thermal source with a desired directionality. The first repeating patterns are thermally coupled to each other to combine the desired directionality of each of the patterns, wherein the combination results in a distributed directionality of the heat from the thermal source thereby reducing a localized concentration of the heat. Other embodiments are disclosed.

20 Claims, 12 Drawing Sheets

(51) Int. Cl.
  *H01L 23/367* (2006.01)
  *H01L 23/522* (2006.01)
  *H05K 5/00* (2006.01)
  *H05K 7/00* (2006.01)
  *H05K 7/20* (2006.01)

(58) Field of Classification Search
  CPC ....... G06F 1/206; G06F 1/20; H01L 23/3677; H01L 23/5226
  See application file for complete search history.

(56) References Cited

U.S. PATENT DOCUMENTS

| | | | |
|---|---|---|---|
| 8,486,822 B2 | 7/2013 | Nam | |
| 2005/0076316 A1 | 4/2005 | Pierrat et al. | |
| 2006/0246621 A1* | 11/2006 | Crippen | H01L 23/36 257/E23.101 |
| 2007/0256039 A1 | 11/2007 | White | |
| 2008/0142975 A1 | 6/2008 | Ning | |
| 2008/0310117 A1 | 12/2008 | Coico et al. | |
| 2009/0109624 A1* | 4/2009 | Chan | H05K 1/0272 29/832 |
| 2012/0096419 A1 | 4/2012 | Mina et al. | |
| 2012/0178252 A1 | 7/2012 | Liu et al. | |
| 2014/0059509 A1 | 2/2014 | Mina et al. | |
| 2014/0089869 A1 | 3/2014 | Sun et al. | |
| 2014/0376857 A1* | 12/2014 | Chantre | H01S 5/1032 438/31 |
| 2015/0121317 A1 | 4/2015 | Lee et al. | |
| 2015/0171053 A1 | 6/2015 | Tani et al. | |
| 2016/0254207 A1* | 9/2016 | Wilkerson | H01L 23/3731 257/288 |
| 2016/0320706 A1 | 11/2016 | Hsu et al. | |
| 2017/0084512 A1 | 3/2017 | Kundu et al. | |
| 2019/0067037 A1 | 2/2019 | Pelletier et al. | |
| 2019/0157180 A1* | 5/2019 | Hsu | H01L 21/486 |
| 2019/0313522 A1* | 10/2019 | Trulli | H01L 23/367 |
| 2019/0323785 A1* | 10/2019 | Eid | H01L 25/0652 |
| 2020/0105887 A1 | 4/2020 | Kundu et al. | |
| 2020/0176349 A1 | 6/2020 | Hsu et al. | |
| 2021/0013034 A1 | 1/2021 | Wu et al. | |
| 2021/0082873 A1* | 3/2021 | Chen | H01L 23/522 |
| 2021/0091056 A1* | 3/2021 | Yu | H01L 25/167 |
| 2021/0257351 A1 | 8/2021 | Chang et al. | |
| 2022/0065692 A1 | 3/2022 | Baudot | |
| 2022/0140475 A1* | 5/2022 | Schober | H01Q 1/38 343/702 |
| 2022/0187550 A1 | 6/2022 | Baudot et al. | |
| 2022/0252911 A1 | 8/2022 | Poulin et al. | |

OTHER PUBLICATIONS

Dhumane, Nishant, "Critical Area Driven Dummy Fill Insertion To Improve Manufacturing Yield", Masters Theses 1911, Retrieved from https://scholarworks.umass.edu/theses/824, Feb. 2014, 61 pages.
Zhang, W. et al., "Buried 3D spot-size converters for silicon photonics", Optica vol. 8, No. 8, Aug. 13, 2021, 7 Pages.
International Search Report & Written Opinion for PCT/US2023/076128 mailed Feb. 20, 2024, 14 pp.

* cited by examiner

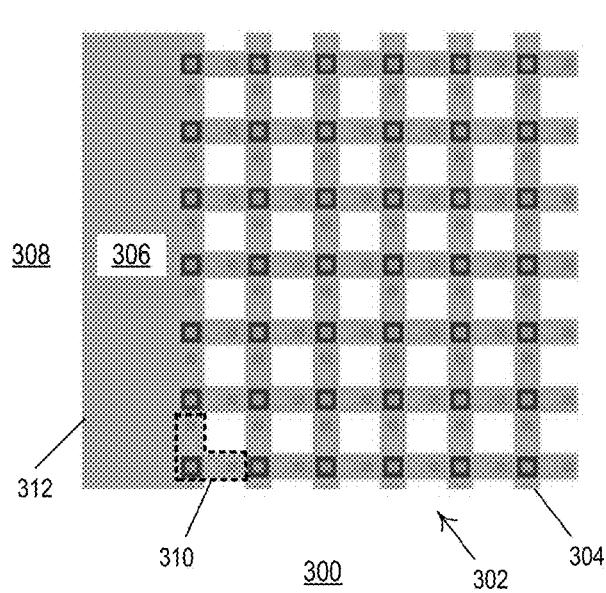 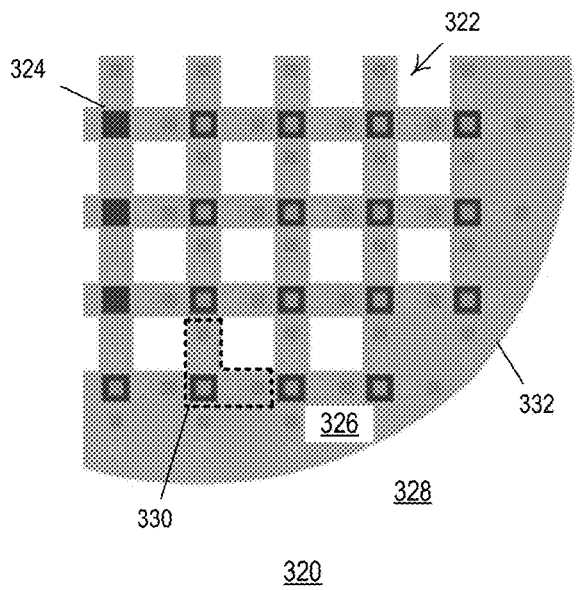
FIG. 3A  FIG. 3B
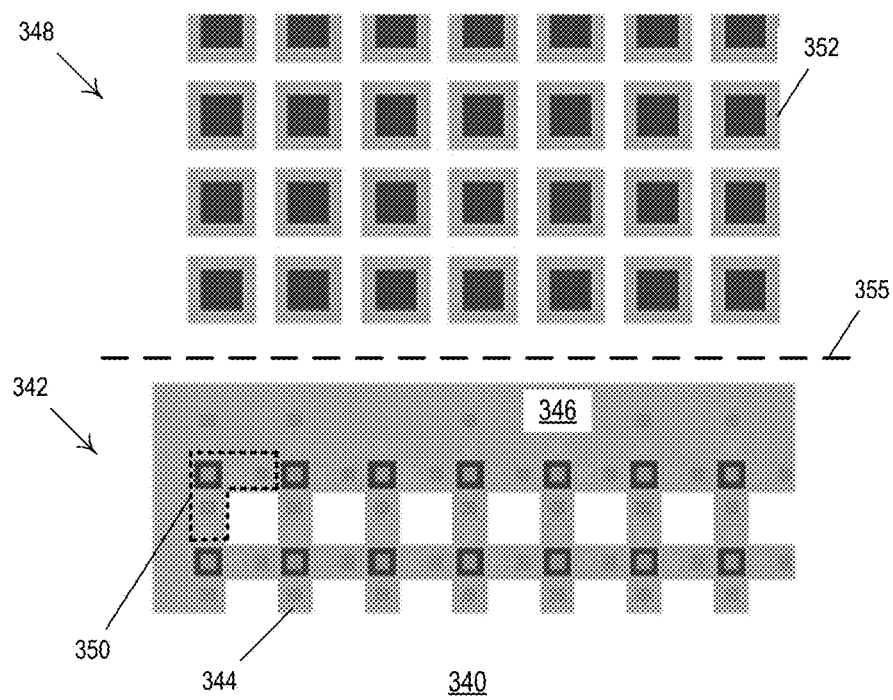
FIG. 3C

400

METHOD AND APPARATUS FOR MANAGING HEAT DISTRIBUTION IN A SEMICONDUCTOR DEVICE

FIELD OF THE DISCLOSURE

The subject disclosure relates to method and apparatus for managing heat distribution in a semiconductor device.

BACKGROUND

Heat sources, including endogenous (e.g., internal transistors, thermal phase shifters, high-current traces for supplying components such as semiconductor optical amplifiers, etc.) or exogenous (e.g., flip-chipped assemblies) heat sources, can exceed thermal dissipation capabilities of a semiconductor platform, negatively hampering device performance or increasing power consumption from external active cooling methods (e.g., thermoelectric coolers).

For example, a standard silicon-on-insulator (SOI) platform can include a thick (multiple hundreds of µm) Si substrate, on top of which a buried oxide layer is formed (2~–3 µm), followed by a thin (150-300 nm) layer of Si. On top of the Si layer, which is patterned to make devices, can also exist layers of germanium (Ge), silicon nitride (SiN), various metals (copper and/or aluminum, TiN), and vias to form interconnections between the Si, Ge, and the various metal layers. Heat can originate or be concentrated in these device layers and thereby cause adverse effects to the operation of a semiconductor device.

BRIEF DESCRIPTION OF THE DRAWINGS

Reference will now be made to the accompanying drawings, which are not necessarily drawn to scale, and wherein:

FIG. 3A-3C are schematic diagrams illustrating portions of example thermal spreading systems that incorporate the thermally conductive structure of FIG. 2A in accordance with various aspects described herein.

DETAILED DESCRIPTION

Figure 1:
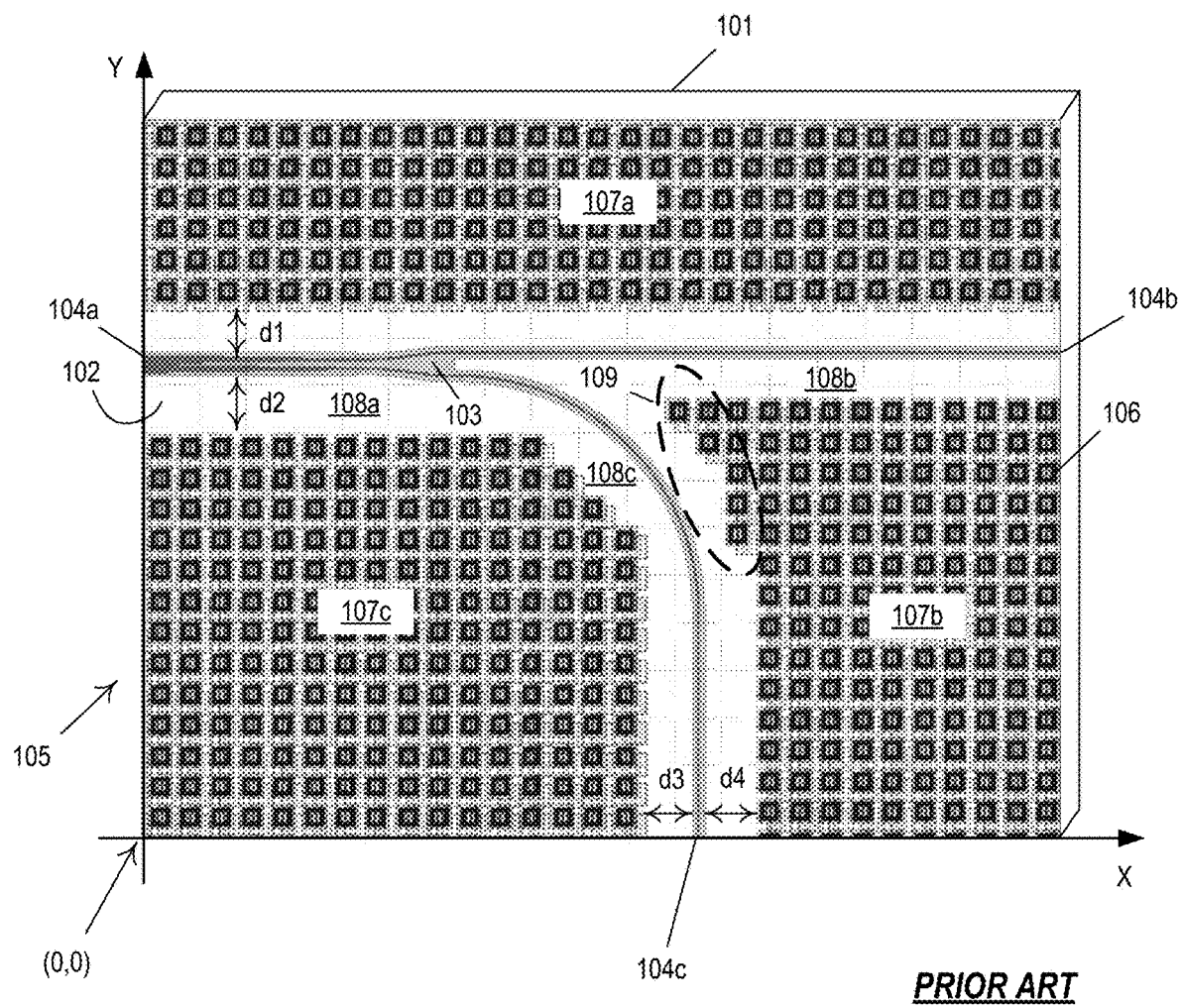
FIG. 1 is a schematic diagram of a portion of a prior art semiconductor device that adjusts a standard tiling pattern to accommodate a structure incorporated into the semiconductor device.

The subject disclosure describes, among other things, illustrative embodiments of repeating, conductive patterns configured for coupling to a thermal source to transfer heat away from the thermal source according to a desired directionality. Repeating conductive patterns are thermally coupled to each other to combine the desired directionality of each of the patterns to obtain a distributed directionality transferring heat away from the thermal source to reduce any unwanted localized concentration of the heat. Other embodiments are described in the subject disclosure.

One or more aspects of the subject disclosure include a process for fabricating a semiconductor device. The process includes providing a semiconductor substrate and forming first a repeating arrangement of thermally conductive patterns, wherein at least a portion of the first repeating arrangement of thermally conductive patterns is configured for coupling to active circuitry. Each of the first repeating arrangement of thermally conductive pattern includes a group of thermally conductive layers. Each of the thermally conductive layers is thermally coupled to a thermal source generated by the active circuitry. Each of the first repeating arrangement of thermally conductive patterns further includes multiple thermally conductive vias interconnecting the group of thermally conductive layers. A combination of the thermally conductive vias and the group of thermally conductive layers is configured to transfer heat from the thermal source with a desired directionality. The first repeating arrangement of thermally conductive patterns are thermally coupled to each other, thereby combining the first desired directionality of each of the first repeating arrangement of thermally conductive patterns, wherein the combining the first desired directionalities results in a distributed directionality of the heat from the thermal source thereby reducing a localized concentration of the heat.

One or more aspects of the subject disclosure include a semiconductor device including a first semiconductor die. The first semiconductor die includes a semiconductor substrate and a thermal spreading system configured for coupling to a thermal source generated by active circuitry. The thermal spreading system includes a first group of thermally conductive patterns. Each thermally conductive pattern includes a group of thermally conductive layers, wherein each layer of the group of thermally conductive layers is thermally coupled to the thermal source generated by the active circuitry. Each thermally conductive pattern further includes a group of thermally conductive vias interconnecting the group of thermally conductive layers. A combination of the thermally conductive vias and the group of thermally conductive layers is configured to transfer heat away from the thermal source with a desired directionality, wherein the first group of thermally conductive patterns are thermally coupled to each other, thereby combining the desired directionality of each of the thermally conductive patterns resulting in a distributed directionality that transfers the heat away from the thermal source to avoid a localized concentration of the heat.

One or more aspects of the subject disclosure include a process that includes receiving heat from a thermal source and coupling the thermal source to a thermal spreading system. The heat may be generated by active circuitry. The thermal spreading system includes a group of thermally conductive structures, each including a group of thermally conductive layers thermally coupled to the thermal source. The thermal spreading system further includes a thermally conductive via interconnecting the group of thermally conductive layers. A combination of the thermally conductive via and the group of thermally conductive layers transfers the heat away from the thermal source according to a desired directionality. The group of thermally conductive structures are thermally coupled to each other to obtain a thermally coupled structure that generates a distributed directionality according to a combination of the desired directionality of each of the thermally conductive structures. The heat is transferred away from the thermal source according to the distributed directionality to avoid a localized concentration of the heat.

Heat can originate in and/or be concentrated in one or more semiconductor device layers and thereby cause adverse effects to the operation of the semiconductor device. The various techniques, including processes, designs, devices, systems, articles of manufacture, disclosed herein relate to high-performance heat management within a semiconductor platform, including a finished assembly.

At least one objective of the heat management is to efficiently conduct the heat in these layers to the substrate, which is itself connected to a larger heat sink. Many modern chip and package assembly schemes use flip-chip techniques, and in many of those assemblies, an objective is to also dissipate the heat generated in the "upper" die into the substrate of the main die, for example the SOI structure described above. In these instances, heat is intentionally conducted from a companion die, into a main die, to be dissipated through the main die according to a main die heat dissipation strategy (e.g., using a main die heatsink).

Without limitation, the example semiconductor devices disclosed herein may represent a silicon photonics chip that may include a photonic integrated circuit (PIC) with various functional elements (e.g., waveguides, modulators, and photodetectors, to provide light to those functional elements).

For example, a semiconductor device may include a waveguide structure integrated into the device itself. The waveguide structure may be configured to confine and guide a propagation of an electromagnetic wave. Some electromagnetic waves have a spectrum that has a peak wavelength that falls in a particular range of optical wavelengths (e.g., between about 100 nm to about 1 mm, or some subrange thereof, also referred to as "optical waves," "light waves," or simply "light," and waveguides for light will be referred to herein as "optical waveguides"). These optical waveguides may be implemented, for example, by forming a core structure from a material having a higher refractive index (e.g., silicon, or silicon nitride) surrounded by a cladding (also called a "buffer") comprising one or more materials, and/or air, which have a lower refractive index. For example, the core structure may be formed by the silicon layer over a buried oxide (BOX) layer (e.g., a silicon dioxide layer, of a substrate, such as a silicon-on-insulator (SOI) wafer), while the cladding might be formed by silicon dioxide deposited on top of the core structure.

The semiconductor devices may include one or more optoelectronic devices, such as a photodetector. The optoelectronic devices (e.g., the photodetector), may be integrated within the PIC, for example, by including a light sensitive semiconductor material to form a photodiode that includes a detection region that is coupled to a waveguide that delivers light to be detected by the photodiode. A photocurrent generated from absorbed light may be collected by metal contacts. For example, the semiconductor material may be grown on a doped surface of a silicon layer forming a conducting path to a first metal contact. The detection region can include a portion formed from intrinsic, i.e., undoped, semiconductor material for absorbing most of the light, and a portion that is doped to make direct physical and electrical contact with a second metal contact in the form of a tapered pillar, or "via," extending through silicon dioxide deposited over the detection region.

The disclosed techniques include a definition of different regions of patterning for a specific purpose of heat sinking and/or providing an increased thermal conductivity. To this end, interconnected layers may be provided for a purpose of heat sinking to increase and/or otherwise enhance thermal dissipation performance beyond that available from regular, untreated SOI platforms. The pattern designs and/or modifications may be adapted to avoid specific device areas in a thermally and/or electrically optimal manner. For example, the pattern designs may include thermally conductive edging that contour to a shape and/or establish a separation distance to one or more other devices that may be included within the same die. In at least some embodiments, the thermally conductive edging is thermally coupled to the pattern designs. In this manner, it can be said that the pattern designs together with the thermally conductive edging provide a conformal mapping to other devices. The disclosed techniques (e.g., by one or more of their tailored patterning of heat spreading elements), their incorporation of avoidances, and/or their inclusion of conformal heat spreading edges, may be adapted to any particularities of a high-speed SOI optical platform, in which design layers may be highly irregular, while still maintaining a conformal mapping of the patterning with precise exclusions.

FIG. 1 is a schematic diagram of a portion of a prior art semiconductor device 100 that adjusts a standard tiling pattern to accommodate a structure incorporated into the semiconductor device 100. The semiconductor device includes a supporting device layer 101 defining a surface layer 102 upon which one or more devices may be formed.

The illustrative semiconductor device 100 includes a waveguide structure 103. The waveguide structure may include at least a portion exposed to the surface layer and another layer integrated into the device layer 101. In general, the waveguide structure 103 confines and guides the propagation of an electromagnetic wave. The example waveguide structure 103 may represent a splitter and/or combiner having multiple legs or branches 104a, 104b, 104c, generally 104, aligned in different directions according to the illustrative design.

The example semiconductor device 100 also includes a fill pattern 105, which may be constructed, at least in part, on the surface layer. The fill pattern 105 may include a conductive material, such as a metal (e.g., copper, aluminum, or gold, and an insulating material, such as an oxide). The fill pattern 105 may be formed by repeating a fill pattern element 106 according to a regular grid that may be aligned with a common reference (e.g., an origin (0,0)). It is understood that neither the fill pattern 105 nor the fill pattern element 106 serve any function that contributes to an intended operation, function and/or purpose served by the semiconductor device 100. Instead, the fill pattern 105 may be incorporated to enhance and/or otherwise improve the results of a semiconductor fabrication process. The fill pattern 105 is usually incorporated to ensure a uniform design density around the device. The fill pattern 105 plays an essential role in the fabrication reproducibility of the waveguide structure 103. The fill pattern 105 is usually a compulsory periodic pattern imposed by the manufacturer.

In fabricating integrated circuits, interconnect film thickness uniformity, device width uniformity, dishing, and erosion may be dependent to at least some degree on variation in layout patterns (e.g., material density, linewidth and/or minimum gap). It has been observed that non-uniform feature density in a design layout may lead to subsequent manufacturability and device critical dimension reproducibility issues. In an effort to avoid such issues, at least some level of uniformity can be added to a design layout by incorporating non-functional design features that tend to improve process uniformity. These features may be referred to as "dummy fill" structures. By modifying an existing layout through an addition of dummy fill, physical parameters such as pattern density, linewidth, and minimum gap are adjusted to become substantially uniform across the layout. For example, adding metal dummy fill structures around metal designs improves a pattern density uniformity, when density is defined as an amount of metal divided by a total area within a given region. Conversely, adding oxide dummy fill structures removes sections of the metal to decrease the pattern density. In at least some instances, dummy fill structures may be employed to achieve and/or otherwise stabilize producibility of design parameters such as mean linewidth and/or mean line space (e.g., to make it uniform across a layout). For example, if dummy fill metal is inserted between two parallel lines, the line space changes for both of those lines. Similarly, if dummy fill oxide is inserted within a conductor, its effective linewidth may be changed. Basically, the dummy fill structures are designed to have mean dimensions of actual devices and are placed to reproduce the relative mean space between actual devices. Thus, the design and the placement of dummy fill structures ensure that the fabrication process is the same everywhere across the wafer substrate. Consequently, device and circuit reproducibility are ensured across the wafer.

According to the illustrative example semiconductor device 100, the fill pattern elements 106 are conductive (e.g., metal, whereas the waveguide structure 103 is constructed of one or more dielectric materials). It is understood that any incursion of the conductive fill pattern 105 into and/or possibly even near to the waveguide structure 103 may interfere with an intended operation of the waveguide structure 103. To avoid any unfavorable consequences, a portion of the fill pattern 105 may be removed to provide at least some coverage separation between the fill pattern 105 and the waveguide structure 103. According to the illustrative example, a semiconductor device layer including the fill pattern 105 includes first avoided region 108a that accommodates a first branch 104a of the waveguide structure 103. Likewise, second and third avoided regions 108b, 108c are provided to accommodate second and third branches 104b, 104c of the waveguide structure 103. In this manner, none of the fill pattern elements 106 overlap, or otherwise encroach upon the waveguide structure 103.

In this manner, the example fill pattern 105 covers three different pattern-fill regions 107a, 107b, 107c of a fill pattern layer of the semiconductor device 100, with each region separated by an avoided region 108a, 108b, 108c, generally 108. It is worth noting, that despite the fill pattern 105 existing in the three different pattern-fill regions 107a, 107b, 107c, generally 107, the remaining individual fill elements 106 of each of the three different pattern-fill regions 107 remain aligned with a common grid spacing (e.g., defined by a local reference or origin within their local regions 107a, 107b, and 107c only). There is no reason for traditional dummy fill structures to be aligned with respect to a global origin. The dummy fill structures are only positioned in vacant regions not occupied by devices. The space with respect to devices is determined by minimum exclusion rules. The actual dummy fill pattern space must be at least greater than the exclusion rule, but it can bigger. The dummy fill pattern position is calculated to ensure that a maximum of structures can be included within a given region without any interference with surrounding devices. The example semiconductor device 100 includes a first distance d1 measured between an adjacent boundary of the first pattern-fill region 107a and an upper edge of a first branch 104a of the waveguide structure 103. A second distance d2 exists between an adjacent boundary of the third pattern fill region 107c and an opposing lower edge of the first branch 104a. According to the illustrative example, d2>d1. Likewise, separation between fill pattern boundaries and adjacent edges of other legs 108 of the waveguide structure 103 may differ (e.g., d4>d3), as long as the minimum exclusion rule which is determined in accordance with device performance is respected It is also worth noting that other boundaries defined by edges of the pattern-fill regions 107 may be irregular when approximating a curved shape. According to the illustrative example, the third branch 104c of the waveguide structure 103 includes a curved portion or bend. The corresponding avoided region 108c is formed by removing and/or otherwise avoiding entire fill-pattern grid cells or elements 106. Namely, there are no partial fill patterns format at boundaries of any of the pattern-fill regions 107. Consequently, curves will include a quantization error corresponding to a size of the individual fill-pattern element. For example, a boundary of the second fill-pattern region 107b defines an edge 109 with the third avoided region 108c. The edge is stepwise linear according to the individual fill patter elements 106. Due to the stepwise linear nature of fill-pattern edges adjacent to curved structures, there will be an irregularity of a lateral spacing between the curved portion and the adjacent boundary. It is understood that such uneven spacings and/or irregularities will not introduce any unwanted effects into operation of the semiconductor device 100 (e.g., by interfering and/or otherwise interacting with operation of an avoided structure), such as the example waveguide structure 103 because they are outside the exclusion zone.

Figure 2A:
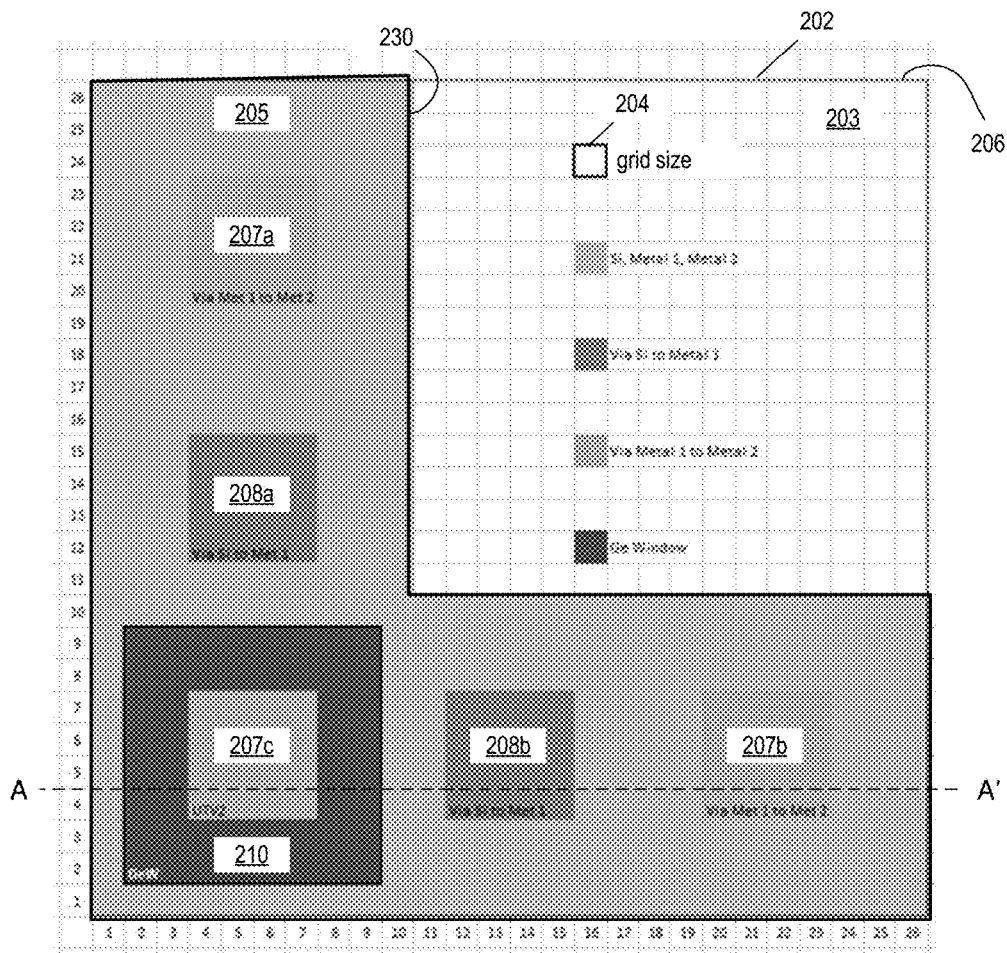
FIG. 2A is a schematic diagram illustrating an example of a thermally conductive, heat spreading structure as may be employed within a semiconductor device thermal spreading system in accordance with various aspects described herein.

FIG. 2A is a schematic diagram illustrating a top-down view of an example of a thermally conductive, heat spreading structure 200 as may be employed within a semiconductor device to transfer, direct and/or otherwise spread heat in accordance with various aspects described herein. An example heat spreading structure 200 provides a patterned design that may include a basic mesh pattern (e.g., a primitive, or unit cell), that may be defined and/or otherwise modified according to the local densities to be targeted within a semiconductor device. The example heat spreading structure 200 is illustrated within a heat-spreading element design cell 202 bounded by a perimeter defining a pattern filled area 206. The example heat-spreading element design cell 202 is defined according to a design feature resolution determined according to an example grid cell 204. For illustration, the example grid cell 204 provides a square design resolution. It is envisioned that other grid cell sizes and/or shapes may be utilized, having sizes that may be larger or smaller, as may be determined according to a design choice, a semiconductor device design, and/or a semiconductor fabrication process. Although the example grid cell 204 is square, it is understood that other shapes may be utilized, such as rectangles, triangles, diamonds, and, more generally, polygons. It is fundamental though, that the heat spreading cell design respects the fill density rules of traditional dummy fill structures. Since the heat spreading structure is expected to be substituted for the dummy fill pattern, it must still provide the same layout uniformity features of the dummy fill pattern and, on top of this, it must spread heat. Although the example grid cell 204 is uniform across the heat-spreading element design cell 202, it is understood that in at least some designs, a design cell may be non-uniform (e.g., including patterns of more than one repeating grid cell shapes and/or utilizing substantially random grid cell shapes and/or sizes as long as the dummy fill density rules are obeyed) Likewise, although the example heat-spreading element design cell 202 is square (e.g., 26×26 grid cells 204), it is understood that other shapes may be utilized, such as rectangles, triangles, diamonds, and, more generally, polygons as long as density rules are respected in the layout.

Preferably, the disclosed heat spreading structure 200, either alone or in combination, spreads the heat from either an internal source within the main die or an external source within an external die (companion die) that may be in intimate electrical and thermal contact with the main die. Spreading the heat efficiently from the local source to a larger area may decrease a thermal resistance path to the heatsink and therefore reduce a temperature of the heat source (e.g., active component(s) localized on the die). Governing thermo-dynamic law dictates that a thermal resistance (Rt) is inversely proportional to an area (A) through which the heat is transferred:

$$R_t = \frac{L}{kA}$$

According to this relationship, k refers to a material's intrinsic thermal conductivity, L refers to a length of the material in a direction of heat flow, and A refers to a cross-sectional area of the material in the direction of heat flow.

The illustrative heat spreading structure 200 includes first region containing a thermally conductive element 205 that borders a second region 203 having a different thermal conductivity (e.g., a lower thermal conductivity as may be provided by an insulator). The example cell 202 includes at least one filled area bounded by one or more unfilled or blank areas that may be collectively referred to as a pattern design. The conductive element 205 represents the filled area, while the remaining are of the cell represents the unfilled area. Although reference is made to filled and unfilled, it is understood that both areas may include a different material having different physical properties. In particular, the filled and unfilled areas may have different thermally conductive properties. The remaining part of the example cell 202, excluding a pattern filled area 206, may be referred to as an insulating window 203. Having at least one insulating window 203 in each cell 202 is essential, because semiconductor design constraints, such as design densities, preclude patterns in which 100% of an available cell surface is filled. Maintaining a ratio of filled to unfilled areas in a cell 202 ensures that a heat spreading structure 200 will respects design densities. It is worth noting here that dummy fill structures are configured as isolated tiles with a given spacing to adhere to design density requirements. In at least some embodiments, dummy structures are replaced by an interconnected mesh of similar structures which, not only respect the density rules, but also spread heat.

According to the illustrative example, the filled area is bounded by an L-shaped perimeter 230 that resides within the pattern filled area 206, whereas the unfilled area is defined by a remaining area of the design cell 202 that is not included within the L-shaped perimeter 230. The filled area may contain a relatively good thermal conductor, such as a metal and/or a semiconductor material, such as Si or Ge. In contrast, the unfilled area may include a relatively poor thermal conductor, such as silicon dioxide ($SiO_2$). Accordingly, it may be advantageous to optimize performance by using as much metal as may be allowed with a goal of achieving the best thermal performance possible under other design and/or fabrication constraints. For example, the addition of carefully designed fill patterns/structures may substantially improve a lateral and/or vertical thermal conductivity in the treated areas of a fabricated circuit. Thus, a generated tile pattern may end up being used for at least two purposes: (1) density maintenance for process uniformity control, and (2) heat propagation enhancement with respect to the $SiO_2$ cladding. Consequently, any design constraints imposed on the heat spreading pattern may be identified to ensure that one or both objectives are properly addressed. Preferably, the heat spreading architecture is designed and/or implemented in such a way that both parameters are considered and optimized. Namely, an amount of thermal conductive material may be increased to ensure good heat spreading without exceeding a maximum allowed by constraints, such as the example pattern densities. The example pattern grids may include an arrangement of vias interconnecting the various metal layers and the Si layer. The Si layer may be doped to enhance free carrier phonon heat transport so that it conforms to the same heat transfer mode as in the overlaying metal layers. Thus, in doing so, thermal interface resistances between the Si and the metal may be reduced or minimized.

The thermally conductive element 205 is arranged according to a design shape defining a pattern filled area 206, wherein an interior region of the pattern filled area 206 includes a thermally conductive material. According to the illustrative embodiment, the design shape perimeter defines an "L" shape, extending along an entire left and lower edges of the pattern filled area 206, and having a thickness of ten (10) grid cells 204, within the plane of the heat-spreading element design cell 202. The remaining thermally insulating region 203 takes the form of a square having sides extending for sixteen (16) grid cell 204. The square sits within an interior region of the "L" shaped thermally conductive element 205 and along upper and right edges of the pattern filled area 206. It is understood that, without limitation, the pattern filled area 206 may define other shapes for the thermally conductive element 205, such as a rectangle, a slash "I" shape, a cross "X" shape, a plus "+" shape, and so on, as long as the design rules provided by the wafer foundry are respected for each layout layer and also as long as the layout density rules are obeyed.

In at least some embodiments, the heat-spreading element design cell 202 is arranged within a plane, which may correspond to a layer of a multilayer semiconductor device. Accordingly, the thermally conductive element 205 may be planar, residing in a plane defined by the heat-spreading element design cell 202. It is envisioned that in at least some embodiments, the heat spreading structure 200 may include a three-dimensional (3D) structure. For example, a 3D heat spreading element may include a first thermally conductive element 205 residing within a first layer of a multilayer semiconductor device and a second thermally conductive element residing within a second layer of the multilayer semiconductor device, and in at least some embodiments, thermally conductive traces and/or vias interconnecting one or more of the thermally conductive elements 205 of the different layers.

It is understood that in at least some embodiments, a 3D heat spreading element may extend over more than two layers, for example, extending over three layers, four layers, and quite possibly up to and including a total number of layers available in a semiconductor device. A multi-layer 3D heat spreading element may include thermally conductive elements in adjacent layers and/or in layers that may be separated by one or more intervening layers. In at least some embodiments, a 3D heat spreading element may extend over adjacent semiconductor layers, such that a first thermally conductive element residing in a first layer overlaps a portion of a second thermally conductive element of a second, adjacent layer. It is envisioned that in such overlapping areas, a thermal coupling between layers may be achieved by intimate contact of the thermally conductive elements, without necessarily requiring a use of thermally conductive vias. Alternatively, or in addition, vias may be used to provide a thermal coupling between thermally conductive elements of non-adjacent layers (e.g., separated by one or more circuit layers, device layers and/or insulating layers).

The example heat spreading structure 200 further includes a first group of thermally conductive vias 207*a*, 207*b*, 207*c*, generally 207. The first group of thermally conductive vias 207 may be thermally coupled to the thermally conductive element 205, which resides in a plane, and extending in a direction into and/or out of the plane (e.g., perpendicular to the plane). It is understood that in at least some embodiments, the first group of thermally conductive vias 207 may be thermally coupled to another thermally conductive element in another layer, separated by one or more intervening layers that may include thermally insulating layers, thermally conductive layers, or combinations of both. It is understood that the vias may provide a thermal channel to facilitate a transfer of heat from one region (e.g., one thermally conductive element 205 to another).

In at least some embodiments, the heat spreading structure 200 further includes a second group of thermally conductive vias 208*a*, 208*b*, generally 208. The second group of thermally conductive vias 208 are thermally coupled to the thermally conductive element 205, which resides in a plane, and extending in a direction into and/or out of the plane (e.g., perpendicular to the plane). Whereas the first group of thermally conductive vias 207 are configured to transfer heat between metal layers, the second group of thermally conductive vias 208 are configured to transfer heat between a metal layer and a semiconductor (e.g., a Si layer).

In at least some embodiments, the heat spreading structure 200 further includes more than one variety of fill materials. For example, a filled portion of a cell, such as that area representing the conductive element 205, may include a first fill material, such as a metal or a thermally conductive semiconductor, such as Si, and a second fill material, such as Ge. Each of the first and second fill materials may have a thermal conductivities that differ but are each substantially greater than that of the unfilled area. According to the illustrative example, the second fill material includes Ge, which is used in a general process to generate optoelectronic components, such as photodiodes. The reason why a Ge window is present in the heat spreader is because Ge is used in the general process to generate photodiodes. If there were no photodiodes, no Ge window would be necessary. Ge is included in the heat spreader 200 to ensure a wafer level process uniformity, as would be done for traditional dummy structures. As mentioned, the heat spreader 200 must also fulfill the expectations of dummy fill structures. The example second filled area 210 including a germanium filler is provided as a Ge window within the boundaries of a first fill material of the conductive element 205. It is understood that a second filled area 210 including a second fill material, such as the Ge window, may be incorporated according to other shapes and/or locations within the cell 202. For example, the second filled area 210 may be provided in the insulating window 203, provided that density rules for the different fill materials are observed. In at least some embodiments, a density of first material, such as a metal may differ from a density of a second material, such as Ge. Accordingly, the pattern filled area 206 may include the first and second fill materials in a proportion that corresponds to their respective densities, such that the densities are observed overall.

Although the example heat spreading structure 200 includes an example number, type, and location of vias 207, 208 and/or second filled area 210, it is envisioned that other arrangements may be used. For example, a common heat spreading structure 200 may be utilized, with one or more of the identified vias 207, 208 being present and/or absent from the illustrated location.

Figure 2B:
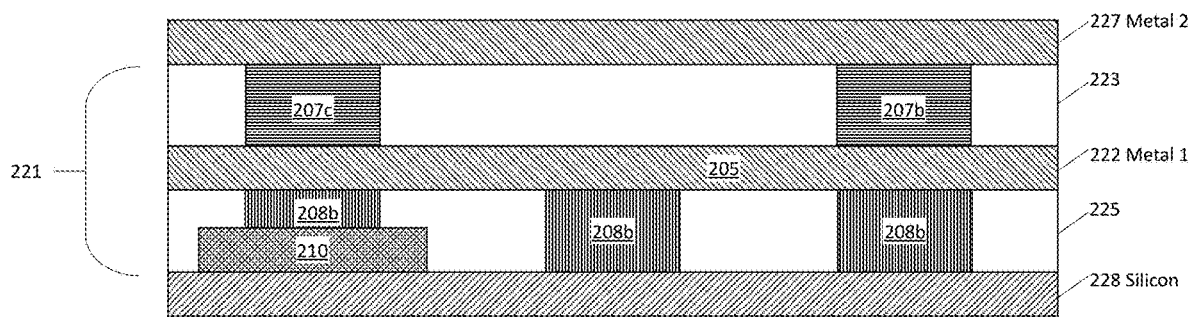
FIG. 2B is a schematic diagram illustrating a cross-sectional view of an example of a thermally conductive, heat spreading structure as may be employed within a semiconductor device to transfer heat in accordance with various aspects described herein.

FIG. 2B is a schematic diagram illustrating a cross-sectional view taken along line A-A', of an example of a thermally conductive, heat spreading element 220 as may be employed within a semiconductor device (e.g., disposed between a metal layer and a semiconductor layer), to transfer heat in accordance with various aspects described herein. The heat spreading element 220 includes a heat-spreader device 221 that includes three layers: a first insulating layer 223, a second insulating layer 225, and a fill-pattern layer 222 disposed between the two insulating layers 223, 225. The fill-pattern layer 222 may include the pattern filled area 206, including a first filled area 205 containing Si or metal and a second filled area 210 including the Ge window. The heat-spreader device 221 may be covered by an upper layer, such as an upper metal and/or semiconductor layer 227. Alternatively, or in addition, heat-spreader device 221 may overlay a lower layer, such as a lower metal layer and/or a semiconductor layer 228. In this arrangement heat conducted at one location along the heat-spreader device, may be spread across the fill pattern layer 222 and to one or more of the upper layer 227 and the lower layer 228 through thermally conductive vias. The example heat spreading element 220 includes a first via 207b thermally coupled between the first filled area 205 and the upper layer 227. A second via 207c is thermally coupled between the second filled area 210 and the upper layer 227. Likewise, a third via 208b is thermally coupled between the first filled area and the lower layer 228.

It is understood that a configuration of the heat spreading element 220 alone or in combination with other interconnected head spreading elements 220 may be controlled by one or more of a lateral extend and/or shape of a pattern filled area, a number of different layers having pattern filled areas, and/or thermally conductive interconnections provided between layers.

The substrate layer 228 may include a semiconductor layer (e.g., a Si layer), which in at least some embodiments, may be thermally coupled to an external heat sink (not shown). For example, a heat sink may be placed against a bottom surface of the substrate layer 228 in a manner to ensure an efficient thermal bond. In this manner, at least a substantial portion of heat transferred to the substrate layer 228, may be extracted by the external heat sink. Examples of external heat sinks may include, without limitation, a thermally conductive mass, such as a metal slab. In at least some embodiments, the thermally conductive mass may be shaped and/or contoured to provide a relatively large heat exchanger surface area, such as a spiked and/or finned metal arrangement. Common materials for external heat sinks include, without limitation, metals, such as copper and aluminum. In semiconductor applications, a substrate material, such as silicon, may serve as a heat sink and/or as a thermal conduit to a separate heat sink device. The foregoing examples may be referred to as passive heat sinks. Other types of heat sinks include active heat sinks, which may include forced air cooling, thermoelectric cooling, pumped liquid cooling and/or phase change devices. A phase change device may include a vapor chamber and/or heat pipes. In at least some embodiments, a passive heat sink may be combined with an active heat sink, such as applying forced air over a finned metal device.

It is envisioned that in at least some embodiments, at least a portion of the first and second thermally conductive regions 205, 205" may overlap. In at least some embodiments, a thermally conductive region 205 is positioned and aligned to ensure a complete overlap (e.g., being fully aligned in orientation and lateral displacement, but for a vertical separation). Alternatively, or in addition, the thermally conductive regions 205, 205" may be offset (e.g., laterally and/or rotationally).

FIG. 3A-3C are schematic diagrams illustrating portions of example thermal spreading systems 300, 320, 340 that incorporate the thermally conductive structure 200 of FIG. 2A in accordance with various aspects described herein. In a first example, a first thermal spreading system 300 includes a pattern array 302 that includes repetition of a heat spreading pattern structure 310. The example heat spreading pattern structure 310 corresponds to the thermally conductive structure 200 (FIG. 2A). The pattern array 302 includes a repetition of the heat spreading pattern structure 310 according to a regular grid. According to the example configuration, the grid spacing ensures that the heat spreading pattern structures 310 are thermally coupled along their edges, without unnecessarily extending, distorting and/or otherwise overlapping within a plane of the semiconductor device.

In more detail, and with respect to FIG. 3A, the example thermal spreading system 300 includes a patterned region 304 defining a surface area of a semiconductor device over which heat is to be conducted, transferred, and/or spread (e.g., according to a directivity that may be tailored by the various design, construction), and arrangement techniques disclosed herein. The patterned region 304 may be substantially filled with heat spreading pattern structures 310 according to the pattern array 302.

In at least some embodiments, the thermal spreading system 300 includes an edge region 306 that defines an edge 312 bordering the patterned region 304 and a non-patterned region 308. It is understood that in at least some embodiments, application of the patterned region 304 may include one or more avoided regions. Such avoided regions may be necessary to accommodate devices (e.g., waveguide structures). In at least some embodiments, the edge region 306 includes a thermally conductive material (e.g., metal), that is deposited and/or otherwise formed in one or more planes of the semiconductor device. For example, the edge region 306 may reside in the same plane(s) as the patterned region 304 such that a thermally conductive structure of the edge region 306 is thermally coupled to the heat spreading pattern structure 310. The combination of the patterned region 304 and the edge region 306 represents a unified portion of the thermal spreading system 300. Beneficially, the edge region may have a width, length, and/or shape that may be designed independent of the heat spreading pattern structure 310. Such freedom in design accommodates precise spacing between the thermal spreading system 300 and other structures of the semiconductor device.

Referring next to FIG. 3B, a thermal spreading system 320 includes an edge region 326 that boarders the patterned region 324 and a non-patterned region 328 and includes repetition of a heat spreading pattern structure 330. The patterned region 324 includes a pattern array 322 that includes a repetition of the heat spreading pattern structure 330 according to a regular grid. The example heat spreading pattern structure 330 corresponds to the thermally conductive structure 200 (FIG. 2A). According to the illustrative example, the edge region 324 provides a continuous, curved boundary 332 that may be designed according to a design requirement to accommodate precise spacing between the thermal spreading system 320 and other structures of the semiconductor device.

In semiconductor technology, in particular CMOS technology, a tiling pattern is made between devices to maintain appropriate local densities of the different semiconductor layers. These layers can be isolated patterns (e.g., squares) or larger interconnected blocks (or meshes).

Interconnected blocks of metal, vias, and doped silicon can form efficient electrical conductors in addition to thermal conductors, but must be evaluated in terms of their electrical impacts, RF or otherwise, an in at least some embodiments, connecting to the same schematic routing paths. For at least these reasons, isolated patterns may be employed in areas of a die that require no special thermal dissipation. The techniques disclosed herein include semiconductor patterns that having both isolated, or regular "dummy" tiling patterns and interconnected patterns for maximum thermal dissipation.

In at least some embodiments, a thermal spreading system may be used in combination with a dummy fill pattern within the same semiconductor device. That is, a thermal spreading system may be used in an area over which heat transfer and/or dissipation is required, while a dummy fill pattern may be used over other areas of the semiconductor. Referring next to FIG. 3C, a thermal spreading system 340 includes an edge region 346 that borders a thermally conductive patterned region 342 and a dummy fill region 348. The dummy fill region 348 may include a repeating arrangement of a common dummy fill pattern element 352 as shown in FIG. 1. According to the illustrative example, the thermally conductive patterned region 342 includes a pattern array 344 that includes a repetition of the heat spreading pattern structure 350 according to a regular grid. The example heat spreading pattern structure 350 corresponds to the thermally conductive structure 200 (FIG. 2A). According to the illustrative example, the edge region 346 provides a continuous edge along a boundary 355 that may be designed according to a design requirement to accommodate precise spacing between the thermally conductive patterned region 342 and other structures of the semiconductor device, such as the dummy fill pattern.

It is understood that in at least some embodiments, the pattern size, shape, and/or spacing of the thermally conductive patterned region 342 may be essentially the same as that used for the dummy fill region 348 with the differences that the patterns within thermally conductive patterned region are: interconnected side-by-side to each other and are made up of an interconnected stack of layers, while still resulting in the same tiling density. Alternatively, or in addition, one or more of the pattern size, shape, and/or spacing may differ between the thermally conductive patterned region 342 and the dummy fill region 348. Whether the sizes, shapes, and/or spacing between the thermally conductive patterned region 342 and the dummy fill region 348 is the same or different, it is envisioned that in at least some embodiments, both may be aligned with a common reference location (e.g., an origin, or an edge).

In at least some embodiments, a pattern grid of the thermally conductive patterned region 342 is different than a pattern grid of the dummy fill region 348. For example, one grid size, shape and/or reference location may be used for the thermally conductive patterned region 342 while another pattern grid having a different size, shape and/or reference location may be used for the dummy fill region 348. In at least some embodiments, a size, shape, and/or reference location (e.g., origin), of the thermally conductive patterned region 342 may be determined according to a device included in and/or attached to the semiconductor device. To the extent that different thermally conductive patterned regions 342 are used within the same semiconductor device, it is understood that the different regions may be designed and/or otherwise fabricated according to a common grid (e.g., having the same size, shape, and/or reference location).

Alternatively, or in addition, the different regions may be designed and/or otherwise fabricated according to different grids (e.g., that may differ according to one or more of size, shape, and/or reference location), or may actually be effectively "gridless", down to the scale of mask/patterning resolution, in the case of a conformal structure (i.e., curved). For example, in at least some embodiments, a first thermally conductive patterned region 342 may be configured according to a first grid determined according to a first device included in and/or attached to the semiconductor device, while a second thermally conductive patterned regions may be configured according to a second grid determined according to the first device and/or a second device included in and/or attached to the semiconductor device.

Figure 4:
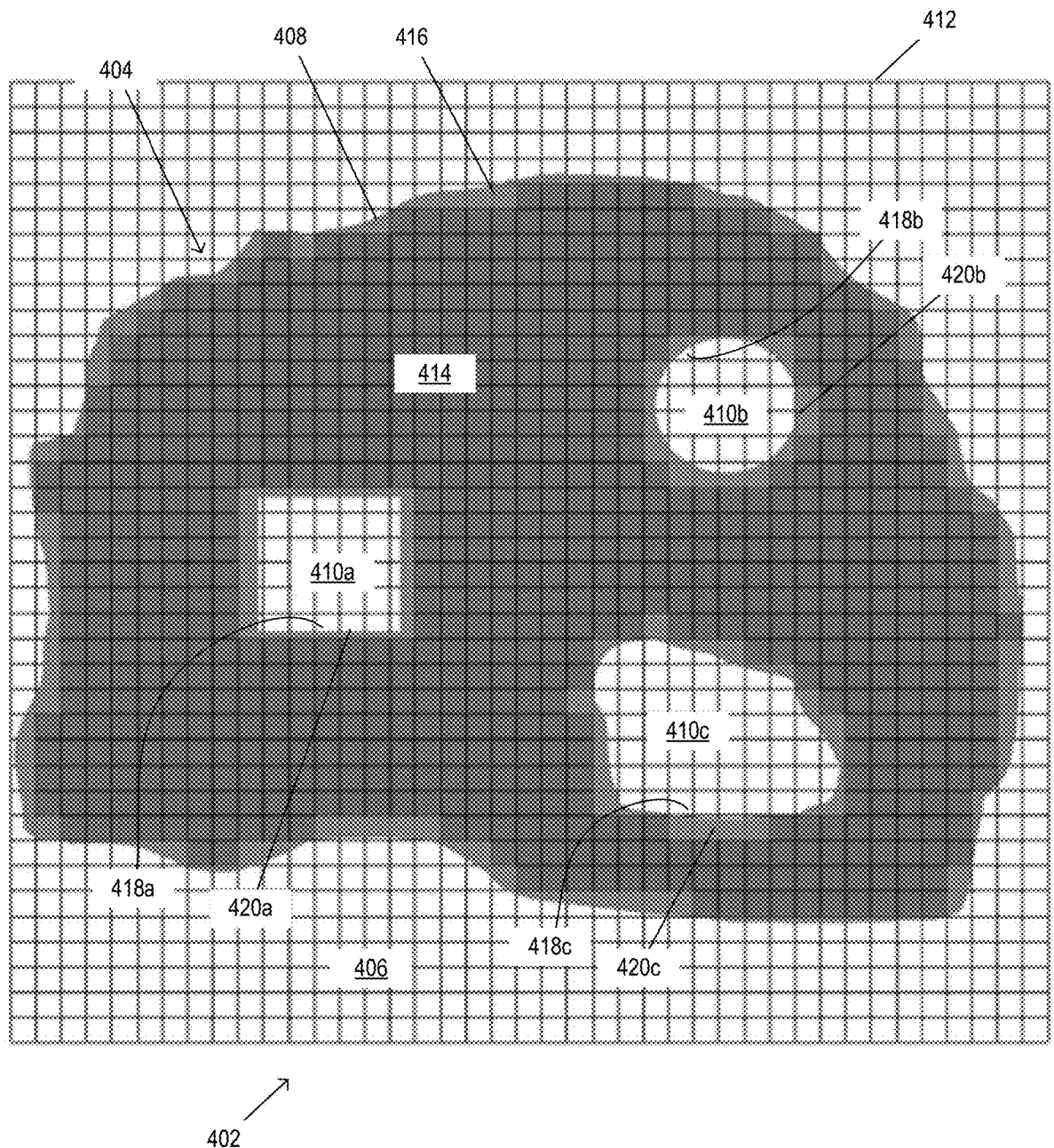
FIG. 4 schematic diagram illustrating a heat-spreader design pattern with exclusions in accordance with various aspects described herein.

FIG. 4 is a schematic diagram illustrating a heat-spreader design pattern 400 with exclusions in accordance with various aspects described herein. The design pattern corresponds to region of a layer of a semiconductor device 402. The example semiconductor device region 410 may refer to a design (e.g., a design template), which may be combined with an integrated circuit design and provided to a semiconductor fabrication facility for fabrication of a semiconductor device incorporating a heat-spreader design according to the heat-spreader design pattern 400. In at least some embodiments, a reference grid pattern 412 may be associated with the semiconductor device region 410. A first thermal spreading region 404 may be identified with respect to the reference grid pattern 412. The first thermal spreading region 404 defines an edge or perimeter 408 that may extend around a complete region that will incorporate at least a portion of a thermal spreading system, distinguishing a thermally treated region from a non-thermally treated region 410. The perimeter 408 may take on any shape, such as a regular shape (e.g., a rectangle), that may align with the reference grid pattern 412. Alternatively, or in addition, the perimeter 408 may take on an irregular shape as may be determined according to one or more of a location of a thermal source and/or other structures of the semiconductor device.

In at least some embodiments, the first thermal spreading region 404, as defined by the perimeter 408, may be discretized according to the reference grid pattern 412, to obtain a discretized thermal spreading region 414. For example, all tiles of the reference grid pattern 412 that fall completely within the first thermal spreading region 414 (e.g., within the perimeter 408), may be identified as candidate locations for inclusion of a heat spreading element, such as the example heat-spreading element design cell 202 (FIG. 2) disclosed herein. Those tiles falling at least partially within the perimeter 408, but not included in the discretized thermal spreading region 414, may be identified as border tiles 416. In at least some embodiments, the border tiles 416 may be configured to include a thermally conducting region that falls within the perimeter 408 and a thermally insulating region that falls outside of the perimeter 408. In at least some embodiments, the remaining thermally insulating area of all the border tiles 416 may be thermally coupled to at least a portion of the heat-spreading element design cells 202 of the discretized thermal spreading region 414 to provide a thermal spreading system that conforms to the perimeter 408.

The foregoing design and/or fabrication technique may be applied to one or more other regions of the same semiconductor device, understanding that the other regions may reside within the same plane or layer of the semiconductor device and/or in other layers of the semiconductor device. To the extent that the techniques are applied in multiple layers, it is understood that the multiple layers may be non-overlapping, overlapping in part, and/or completely overlapping. Alternatively, or in addition, one or more of a multi-layer embodiment may be interconnected at one or more locations (e.g., according to thermally conductive vias 207, 208 (FIG. 2A)).

In at least some embodiments, it may be necessary to avoid applying heat-spreading element design cells 202 within at least some regions that may fall within the perimeter 418 of the thermal spreading region 404. These avoided regions may be necessary to accommodate other devices, structures, and/or circuits that may be included within the semiconductor device. According to the illustrative example, the thermal spreading region 404 includes a first avoided region 410a. The first avoided region 410a defines a first perimeter 418a having a generally rectangular shape that may not align with the reference grid pattern 412. A discretized approach may be taken to address the avoided regions (e.g., by removing heat-spreading element design cells 202 from all tiles of the reference grid pattern 412 that fall completely or partially within the first avoided region 410a). Those tiles falling at least partially within the perimeter 418a, but not included in the discretized thermal spreading region 414, may be identified as border tiles 420a. In at least some embodiments, the border tiles 420a may be configured to include a thermally conducting region that falls between the perimeter 418a and the thermal spreading region, and a thermally insulating region that falls between the perimeter 418a and the first avoided region 410a. In at least some embodiments, the remaining thermally insulating area of all the border tiles 420a may be thermally coupled to the heat-spreading element design cells 202 of the discretized thermal spreading region 414 to provide a thermal spreading system that conforms to the perimeter 418a.

Similar approaches may be applied to a second avoided region 410b, defining a generally oval perimeter 418a, and to a third avoided region 410c, defining a generally arbitrarily shaped perimeter 418c, such that avoided regions 410b, 410c are formed, having border tiles 420b, 420c that may be thermally conductive and/or coupled to the heat-spreading element design cells 202 of the discretized thermal spreading region 414.

Figure 5:
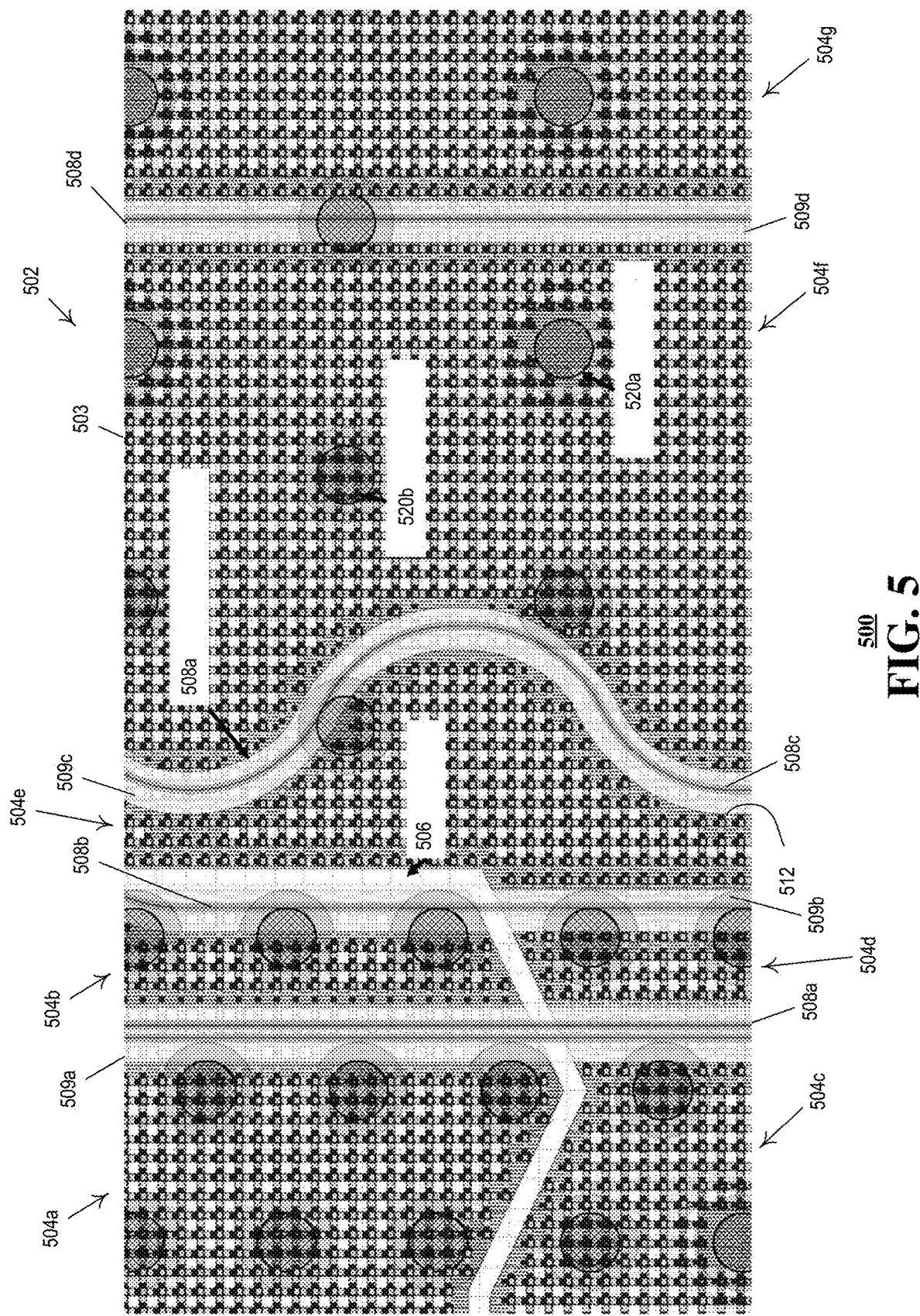
FIG. 5 is a schematic diagram illustrating a portion of a semiconductor device incorporating an example of a conformal thermal spreading system that incorporates the thermally conductive structure of FIG. 2A in accordance with various aspects described herein.

FIG. 5 is a schematic diagram illustrating a top-down, transparent view of a portion of a semiconductor device 500 incorporating an example of a conformal thermal spreading system that incorporates the thermally conductive structure 200 of FIG. 2A in accordance with various aspects described herein. Namely, the illustration shows a planar view of the semiconductor device 500, reflecting details of different semiconductor layers in an overlaid manner, as if all layers were visible at once.

Wide planes can be defined to accommodate large typical circuit elements such as VCC and GND. As disclosed herein these various planes can be separated with gaps to avoid electrical shorts. Devices that are not part of a given circuit or routing path, such as specific metal connections, bumps, and/or optical waveguides, may be avoided on any relevant layers which might otherwise create interference. For example, an optical waveguide may require removal of part of a pattern, possibly an entire pattern, in an avoided region and across all layers, except that in at least some instances, metals high enough in a layer stack that may not to be "seen" optically by the waveguide mode may remain. A metal trace requires the removal of vias and the addition of gap that would otherwise connect it electrically to the rest of the plane. These planes are otherwise uninterrupted. Large electrical planes further help thermal dissipation by reducing electrical path resistances.

The semiconductor device 500 may include a number of raised conductive areas, referred to as conductive pillars, solder balls, or simply, conductive bumps. The conductive pillars and/or bumps may include a metal, such as copper, aluminum, silver, tin, gold, and/or combinations of materials, such as SnAg. Such conductive bumps 520a, 520b, generally 520, may be provided on an external surface of a semiconductor device for interconnection to another device, such as a companion die or chip, interconnected to the main die surface according to an inverted configuration (e.g., a flip chip arrangement). In some embodiments, a companion die may be interconnected to the main die via an intervening conductive element, such as a conductive column, pin or plane. The example semiconductor device 500 also includes several optical waveguide structures 508a, 508b, 508c, 508d, generally 508 that may be integrated into one or more layers of the semiconductor device 500. Also illustrated is a thermal spreading system 502 that incorporate a repetitive patterned array of thermally conductive structures, such as an array of repeating conductive unit cells 503, such as the example thermally conductive structures 200 of FIG. 2A in accordance with various aspects described herein.

The thermal spreading system is partitioned into separate thermal spreading region 504a, 504b, 504c, 504d, 504e, generally 504. A first thermal spreading region 504a is bounded at least in part by a first avoided region 509a that accommodates a first optical waveguide structure 508a, and a plane gap 506. The plane gap 506 may be provided to provided thermal isolation, electrical isolation, or both. A second thermal spreading region 504b is bounded at least in part by the first and second avoided regions 509a, 509b that respectively accommodates the first and second optical waveguide structure 508a, 508b, and the plane gap 506. A third thermal spreading region 504c is bounded at least in part by the first avoided region 509a and the plane gap 506. A fourth thermal spreading region 504d is bounded at least in part by the first and second avoided regions 509a, 509b and the plane gap 506. A fifth thermal spreading region 504e is bounded at least in part by second avoided region 509b, the plane gap 506, and a third avoided region 509c that accommodates a third optical waveguide structure 508c. A sixth thermal spreading region 504f is bounded at least in part by the third avoided region 509c and a fourth avoided region 509d that accommodates a fourth optical waveguide structure 508d. And, finally, a seventh thermal spreading region 504g is bounded at least in part by the fourth avoided region 509d.

It is worth noting that at least some of the thermal spreading regions 504a, 504b, 504c, 504d, 504e, 504f, 504g, generally 504, may incorporate a conformal edge 512 that provides a designed separation region to the optical waveguide structure 508c. The conformal edges (e.g., according to a design) may maintain a preferred (e.g., an even) spacing between the thermal spreading region 504 and the optical waveguide structure 508.

It is worth noting further that in some applications the thermal spreading region 504 may extend across (e.g., without interruption), under a conductive bump 520. An example of a, so-called, covered bump 520b illustrates an uninterrupted pattern of the array of repeating conductive unit cells 503 extending under the covered bump 520b. Alternatively, or in addition, the thermal spreading region 504 may avoid a conductive bump 520. An example of a, so-called, avoided bump 520a illustrates an interrupted pattern of the array of repeating conductive unit cells 503 that does not extend under the avoided bump 520a.

Figure 6:
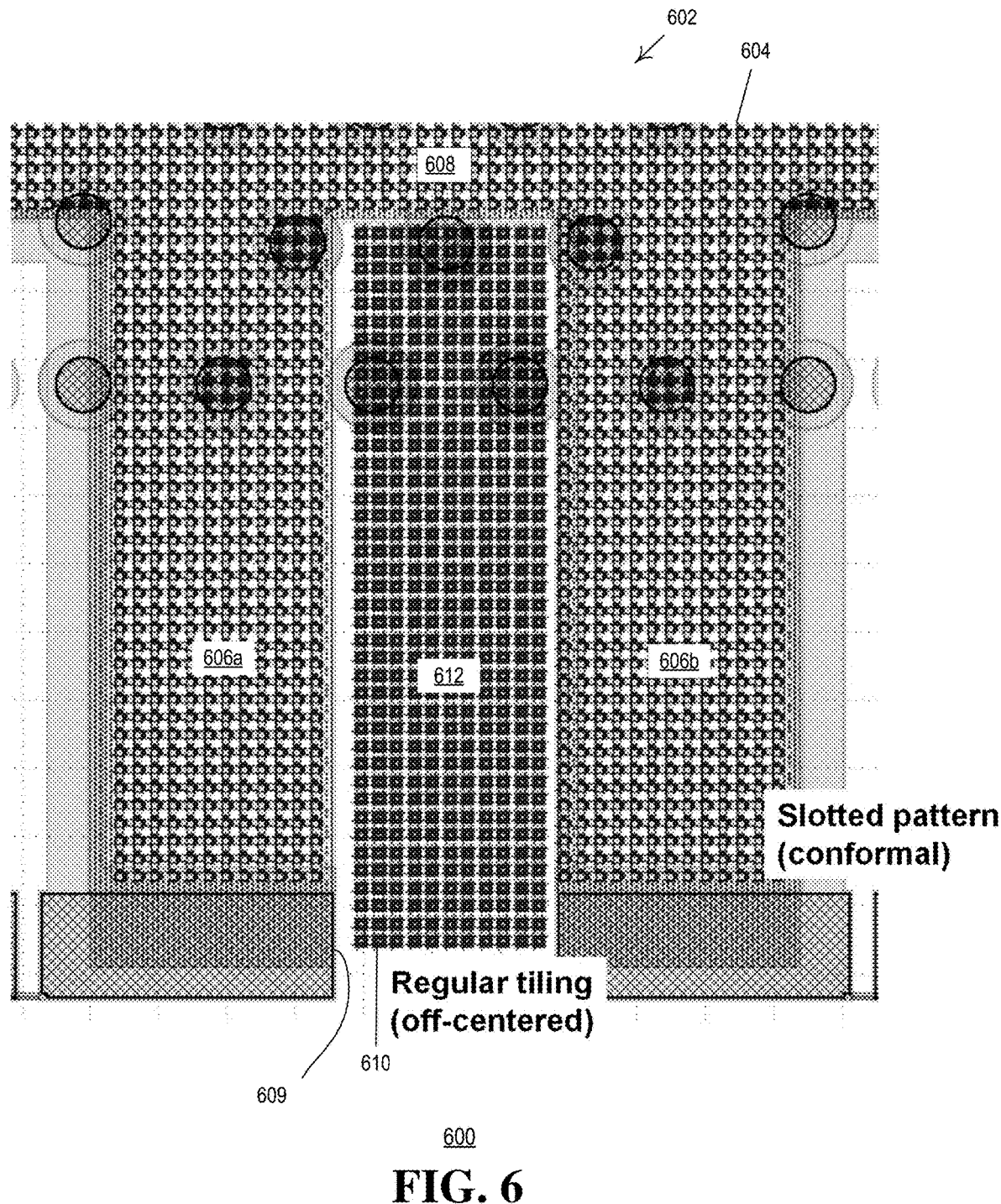
FIG. 6 is a schematic diagram illustrating a portion of a semiconductor device incorporating an example of a combination of a standard tiling together with a conformal thermal spreading system that incorporates the thermally conductive structure of FIG. 2A in accordance with various aspects described herein.

FIG. 6 is a schematic diagram illustrating a portion of a semiconductor device 600 incorporating an example of a combination of a standard tiling together with a conformal thermal spreading system that incorporates the thermally conductive structure 200 of FIG. 2A in accordance with various aspects described herein.

Centering of a heat spreading pattern around a structure, such as an electrical waveguide, may be important for RF performance. Generation of a heat spreading pattern may be accomplished from a filled area to which the pattern is imprinted (e.g., a form of slotting), as opposed to replication of a heat spreading pattern from a universal initial coordinate, which may not guarantee good alignment with RF-sensitive structures. First, an area to be filled with the pattern may be determined using a relevant design layer, together with exclusion rules with respect to the circuit. Then, an exclusion edge may be calculated to avoid having inhomogeneous edges. Next, a slotting routine may be applied to a central, non-excluded area. Finally, interlayer connection may be ensured using another routine (e.g., by inserting vias whenever and wherever applicable). Such a conformal mapping technique may further help to avoid an appearance of design rule errors at any critical edges, without otherwise using large exclusion areas and thus decreasing the efficiency of the thermal conductivity.

According to the illustrative example, a thermal spreading system includes a heat-spreading pattern array 602 that includes repetition of a heat spreading pattern structure, such as an array of repeating conductive unit cells 604. The heat-spreading pattern array 602 includes a first protruding segment 606a and a second protruding segment 606b extending away from an upper region 608 and forming a gap therebetween. The first protruding segment 606a defined as an edge 609. In at least some embodiments, a repeating pattern of the array of repeating conductive unit cells 604 may extend across each of the upper region 608 and the first and second protruding segments 606a, 606b, according to a regular spacing and in an unbroken and/or otherwise uninterrupted fashion. An avoid or gap region is formed between opposing edges of the first and second protruding regions 606a, 606b, and a lower edge of the upper region 608. It is understood that in at least some embodiments, discretization techniques, such as those disclosed elsewhere herein, may be employed in forming the gap.

In at least some embodiments, some if not all of a semiconductor layer not occupied by a device and/or the pattern array 602 may be treated with a dummy fill pattern. According to the illustrative example, a dummy fill region 612 extends into the avoided region between the protruding segments 606a, 606b. The dummy fill region 612 may include a regular repeating array of a common, non-functional pattern 610. In at least some embodiments, the dummy fill region 612 does not overlap any portion of the pattern array 602.

It is worth noting here that a first gap formed between a right edge of the left protruding segment 606a and a left edge of the dummy fill region 612 is larger than a gap formed between a left edge of the right protruding segment 606b and a right edge of the dummy fill region 612. At least one reason that uneven spacing may result is that the dummy fill region 612 is generally applied across an entire layer according to a common grid (e.g., having a common reference, such as a common origin). Alternatively, the pattern array 602 may be applied across an entire layer according to a different reference, such as a different origin. For example, the reference used for the pattern array 602 may correspond to one or more features, structures and/or other devices integrated into, formed upon and/or otherwise connected to the semiconductor device. Other devices might include integrated circuit elements, waveguide structures, conductive bumps and/or flip chip attachments. In at least some embodiments, more than one pattern array 602 regions of a common semiconductor layer may be aligned differently (e.g., to different features, structures and/or other devices integrated into, formed upon and/or otherwise connected to the semiconductor device).

Such precise control on spacing alone and/or in combination with the conformal edges disclosed elsewhere herein, may be beneficial in placing pattern arrays 602 proximate to semiconductor devices, such as radio frequency (RF) structures, such as waveguides, transmission lines, signal traces, and/or antennas.

Figures 7A, 7B:
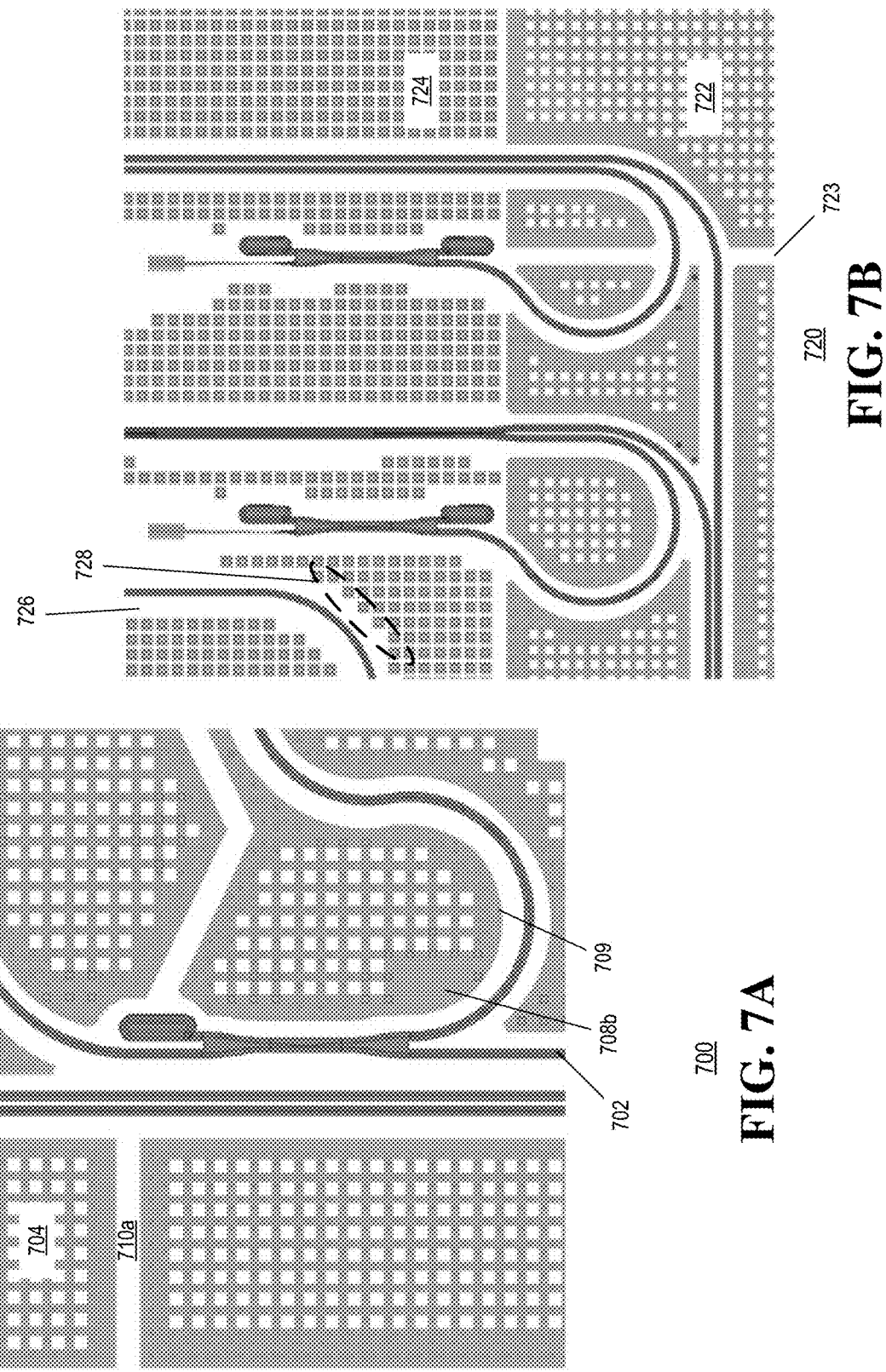
FIG. 7A is a schematic diagram illustrating a portion of a semiconductor device incorporating another example of a conformal thermal spreading system that incorporates the thermally conductive structure of FIG. 2A in accordance with various aspects described herein.
FIG. 7B is a schematic diagram illustrating a portion of a semiconductor device incorporating another example of a combination of a standard tiling pattern together with a conformal thermal spreading system that incorporates the thermally conductive structure of FIG. 2A in accordance with various aspects described herein.

FIG. 7A is a schematic diagram illustrating a portion of a semiconductor device 700 incorporating another example of a conformal thermal spreading system that incorporates the thermally conductive structure of FIG. 2A in accordance with various aspects described herein. The semiconductor device 700 includes one or more integrated structures, such as optical waveguides 702, splitters, combiners, and the like. The semiconductor device 700 also includes one or more pattern arrays 704 of a thermal spreading system 705 that includes repetition of a heat spreading pattern structure 706.

The pattern arrays 704 may be applied in those areas of the semiconductor device 700 in which it is advantageous to spread and/or otherwise transfer heat from a localized region to a larger area and/or to an external heat sink. In at least some embodiments, the pattern arrays 704 include edge regions 708a, 708b that border avoided regions 710a, 710b, generally 710. The avoided regions 710 may be introduced to accommodate and/or otherwise avoid interfering with other features, structures and/or other devices integrated into, formed upon and/or otherwise connected to the semiconductor device, such as the example optical waveguides 702. The edge regions 708a, 708b may contour to a perimeter (e.g., perimeter 709), and conform to an avoided region (e.g., providing a uniform spacing and/or smooth transition that may follow a linear region, a curved region, or some combination of both, as may be necessary).

FIG. 7B is a schematic diagram illustrating a portion of a semiconductor device 720 incorporating another example of a combination of a standard tiling pattern together with a conformal thermal spreading system that incorporates the thermally conductive structure 200 of FIG. 2A in accordance with various aspects described herein. The semiconductor device 720 includes a thermal spreading system that includes a heat-spreading pattern array 722 extending over at least a portion of the semiconductor device 720. The heat-spreading pattern array 722 includes avoided areas 723 that are not covered by the heat-spreading pattern array 722. The example semiconductor device 720 also includes a dummy pattern array 724 extending over at least another portion of the semiconductor device 720. The dummy pattern array 724 also includes avoided areas 726 that are not covered by the dummy pattern array 724.

It is worth noting in the illustrative example, that boundary edges of the avoided areas in the region including the dummy pattern array 724 include uneven and/or discretized borders, such as those along a boundary edge 728, that may result in uneven spacing to other structures. In contrast, the boundary edges of the avoided areas in the region including the heat-spreading pattern array include smooth, contoured borders that offer even spacing to other structures.

Figure 8A:
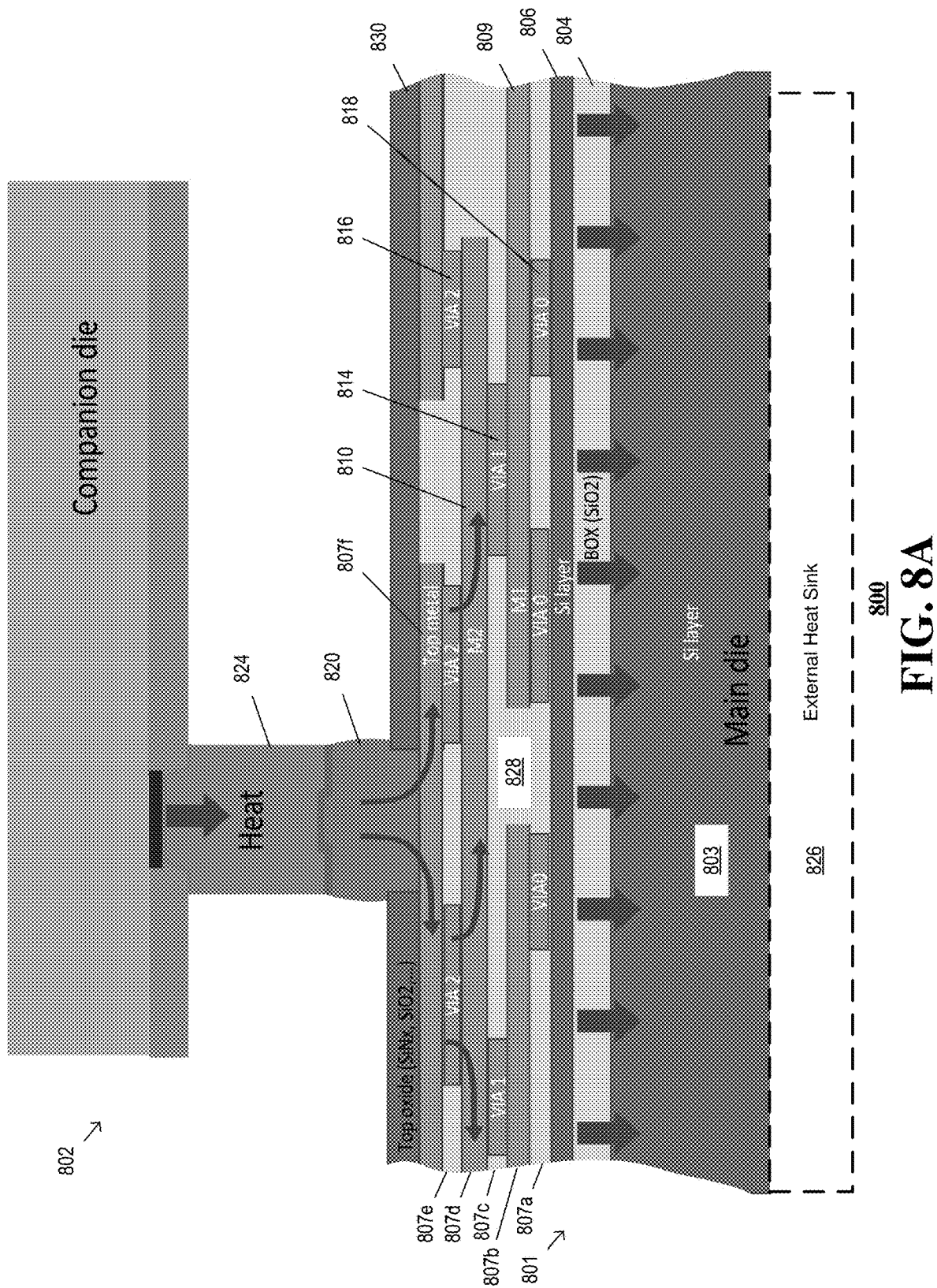
FIG. 8A is a schematic cross-section diagram illustrating a portion of a semiconductor device incorporating an interconnected, multi-die arrangement, together with an example of a thermal spreading system in accordance with various aspects described herein.

FIG. 8A is a schematic cross-section diagram illustrating a portion of a semiconductor device 800 incorporating an interconnected, multi-die arrangement, together with an example of a thermal spreading system in accordance with various aspects described herein. The example multi-die arrangement includes a conductive pillar style interconnect (e.g., utilizing conductive columns 824, which may include copper pillars). The semiconductor device 800 includes a main die 801 including a top oxide layer 830 and a companion die 802 positioned above the top oxide layer 830. The main die 801 includes a base or substrate layer (e.g., a Si substrate 803). A buried oxide (BOX) layer 804 is formed upon an upper surface of the Si substrate 803 and a relatively thin Si layer 806 is formed over at least a region of the BOX layer 804.

One or more other layers (e.g., device and/or wiring or network, or more generally, routing, device, conductive and/or insulating layers, 807a, 807b, 807c, 807d, 807e, 807f, generally 807), may be formed in succession over the thin Si layer 806. A first device layer 807a includes one or more thermally conductive vias 818 that are adapted to transfer heat between a metal layer and a semiconductor layer (e.g., between a metal portion 809 of the second layer 807b and the relatively thin Si layer 806). A third insulating layer 807c may include a first arrangement of one or more electrically conductive vias 814 (e.g., between a metal 810 of a fourth device layer 807d and the metal portion 809 of the second device layer 807b). It is understood that at least some of the routing layers 807b, 807d may include a metal portion 809, 810 and an insulator of an avoided region 828. In at least some embodiments, a fifth insulating layer 807e may contain a second arrangement of one or more electrically conductive vias 816 (e.g., between a metal portion 810 of the fourth device layer 807d and a top metal layer 807f).

In at least some embodiments, device layers including the vias 818, 816, 814, may include an insulating material (e.g., SiO$_2$, in between the vias 818, 816,814). In at least some embodiments, one or more of the metal device layers 807b, 807d and/or the top metal layer 812 may include one or more thermally thermal spreading system that incorporate a thermally conductive structure, such as the structure 200 illustrated in FIG. 2A, in accordance with various aspects described herein. It is understood that incorporation of a thermally conductive, heat-spreading structure may avoid some regions of the semiconductor device 800. The illustrative embodiment includes at least one example of an avoided region 828 that may contain a waveguide structure, such as an optical waveguide.

The companion die 802 may generate heat. For example, in some high-speed communication applications, the companion die 802 may include one or more devices that generate up to several watts of power. Such high concentrations of power must be transferred from the companion die 802 to the main die 801 and preferably to a separate heat sink 826, which may be disposed on an opposite side of the main die 801.

The example companion die 802 is coupled to the main die 801 using one or more conductive bumps 820. The conductive bumps 820 of the main die 801 may be thermally and/or electrically coupled to the companion die 802 through one or more conductive members (e.g., conductive columns 824). The conductive columns may include electrical contacts configured to abut the conductive bumps 820, and, upon an application of sufficient energy, may be coupled (e.g., via a bonding, welding and/or soldering process). Alternatively, or in addition, the coupling may be accomplished by a make and break type interconnect allowing the companion die 802 to be attached, removed, and reattached as might be necessary, without using a bonding, welding and/or soldering process.

According to the illustrative example, an exogenous heat source is represented by heat generated by active circuitry in the companion die 802 is transferred to main die 801 via a coupling of the conductive contact or bump 820 and the conductive column 824. The heat is transferred to a thermally conductive, heat spreading structure integrated into the main die 801 via the conductive bump 820. The conductive bump 820 represents a thermally localized region.

According to the illustrative example, the conductive bump 820 is in communication with the top metal layer 812, which includes a thermally conductive area greater than an area of the conductive bump 820.

Accordingly, thermal energy is transferred from the conducive bump 820 having a relatively small area, to the top metal layer 812, which may have a much larger area. The thermal transfer process may continue from the top metal layer 812 to a second metal portion 810 of the fourth device layer 807d through the vias 816. An area of the second metal portion 810 of the fourth device layer 807d may be greater than, equal to, or less than an area of the top metal layer 812. The thermal transfer process may continue further from the second metal portion 810 of the fourth device layer 807d through the vias 814 to a first metal portion 809 of the second device layer 807b, and from there, to the relatively thin Si layer 806 through the vias 818. An area of the first metal portion 809 of the second device layer 807b may be greater than, equal to, or less than an area of the second metal portion 810 of the fourth device layer 807d. A thermal load at the relatively thin Si layer 806 may transfer through the BOX layer 804 and into the Si substrate layer 803. To the extent that the Si substrate layer 803 is in communication with a heat sink 826 which may dissipate heat transferred from the companion die 802.

Figure 8B:
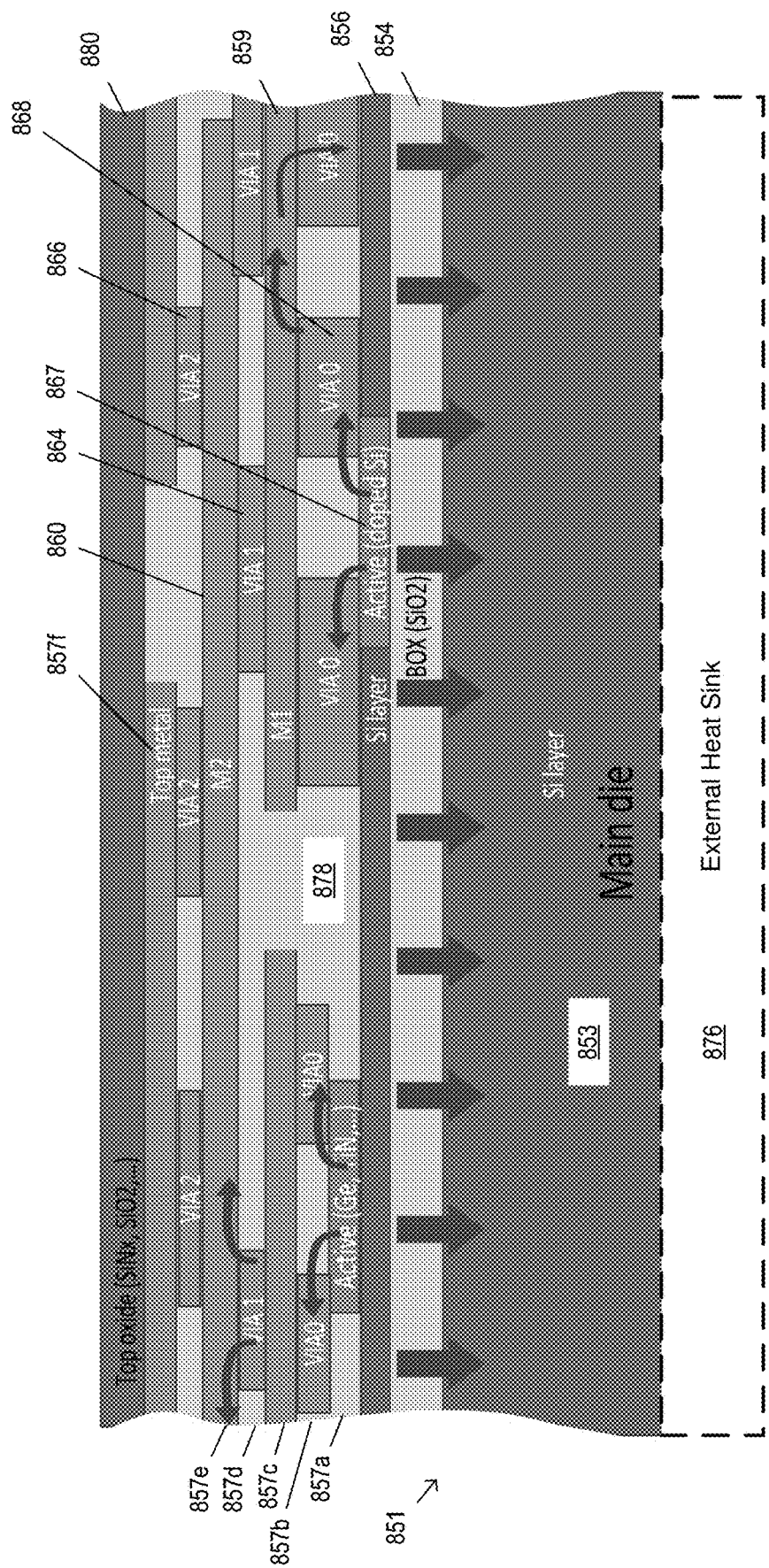
FIG. 8B is a schematic cross-section diagram illustrating a portion of a semiconductor device incorporating an example thermal spreading system in accordance with various aspects described herein.

FIG. 8B is a schematic cross-section diagram illustrating a portion of a semiconductor device 850 incorporating an example thermal spreading system in accordance with various aspects described herein. The semiconductor device 850 includes a main die 851. The main die 801 includes a base or substrate layer (e.g., a Si substrate 853). A buried oxide (BOX) layer 854 is formed upon an upper surface of the Si substrate 853 and a relatively thin Si layer 856 is formed over at least a region of the BOX layer 854.

One or more other layers (e.g., device and/or wiring or network, or routing, conductive or insulating layers, 857a, 857b, 857c, 857d, 857e, 857f, generally 857), may be formed in succession over the thin Si layer 856. A first device layer 857a includes one or more special vias 868 that are adapted to spread and/or otherwise transfer heat between a metal layer and a semiconductor layer (e.g., between a metal portion 859 of the second insulating layer 857b and the relatively thin Si layer 856). A third device layer 857c may include a first arrangement of one or more electrically conductive vias 864 (e.g., between a metal portion 860 of a fourth insulating layer 857d and the metal portion 859 of the second insulating layer 857b). In at least some embodiments, a fifth device layer 857e may contain a second arrangement of one or more electrically conductive vias 866 (e.g., between the metal portion 860 of a fourth insulating layer 857d and a top metal layer 857f, for example, just below a top oxide layer 880).

In at least some embodiments, device layers and/or insulating layers including the vias 868, 866, 864, may include an insulating material (e.g., SiO2), in between the vias 868, 866, 864. In at least some embodiments, one or more of the insulating layers 857b, 857d and/or the top metal layer 857f may include one or more thermally thermal spreading system that incorporate a thermally conductive structure 200, such as the one illustrated in FIG. 2A, in accordance with various aspects described herein. It is understood that incorporation of a thermally conductive, heat-spreading structure may avoid some regions of the semiconductor device 850. The illustrative embodiment includes at least one example of an avoided region 878 that may contain a waveguide structure, such as an optical waveguide.

The example semiconductor device 850 included active circuitry 867 capable of generating heat. For example, in some high-speed communication applications, the active circuitry 867 may dissipate a relatively high concentrations of power that generates heat, which must be transferred from the active circuitry 867 to the Si substrate layer 853 and preferably to a separate heat sink 876, which may be disposed on an opposite side of the main die 851.

According to the illustrative example, an endogenous heat source is represented by heat generated by active circuitry 867 integrated within the main die 851. The heat is transferred from the heat source (e.g., the integral active circuitry 867) to a thermally conductive, heat spreading structure integrated into the main die 851 (e.g., through one or more vias 868, 866, 864). The active circuitry 867 represents a thermally localized region. According to the illustrative example, a first active circuitry 867 resides in the relatively thin Si layer 856 and is in communication with the first metal portion 859 of the second insulating layer 857b, which includes a thermally conductive area greater than an area of the active circuitry 857.

Accordingly, thermal energy is transferred from the active circuitry 867 having a relatively small area, to the first metal portion 859, which may have a much larger area. The thermal transfer process may continue from the first metal portion 859 to a second metal portion 860 through the vias 864. An area of the second metal portion 860 may be greater than, equal to, or less than an area of the first metal portion 859. The thermal transfer process may continue further from the second metal portion 860 through the vias 866 to the top metal layer 857f. Alternatively, or in addition, the illustrative thermal transfer process may continue in an opposite direction (e.g., from the top metal layer 857f then to the second metal portion 860, then to the first metal portion 859 and from there, to the relatively thin Si layer 856 through the vias 868). Thus, heat transfer may occur in multiple directions, spreading in area and ultimately directed towards a heat sink.

An area of the first metal portion 859 may be greater than, equal to, or less than an area of the second metal portion 860. A thermal load at the relatively thin Si layer 856 may transfer through the BOX layer 854 and into the Si substrate layer 853. To the extent that the Si substrate layer 853 is in communication with a heat sink 876 which may dissipate heat transferred from the active circuitry 857.

In at least some embodiments, heat spreading for an exogenous heat source may draw heat from an external device, such as a companion die 802, into a main die 801 (FIG. 8A). A localized region within the main die toward which heat is drawn from the external source may represent a localized heat source within the main die. Likewise, heat spreading for an endogenous heat source may draw heat from an internal device, such as active circuitry 857, within a main die 851 (FIG. 8B). A localized region within the main die including and/or surrounding the active circuitry 867 may represent a localized heat source within the main die. The various heat spreading devices and/or systems are designed, fabricated and operated to draw heat away from the localized heat source, by spreading the heat away from the localized heat source.

In at least some embodiments, the heat spreading is performed according to a predetermined and/or otherwise desired directivity. For example, the heat spreading may spread heat in a preferred direction from a thermal source towards a heat sink. It is understood that a heat sink may be provided along one or more of a bottom surface of the main die, along a top surface of the main die, along an edge of the main die and/or within the main die itself. In such instances, a directivity of a heat spreading system may direct heat towards the heat sink. In some embodiments, a path of the heat spreading may be direct, for example, spreading in one direction from a conductive contact at a top of the main die, downward towards a heatsink attached to a bottom of a substrate of the main die. In at least some embodiments, the spreading may occur in at least two directions, for example, spreading downward and outward as may be represented by triangular, conical, paraboloidal, and/or trapezoidal arrangements having a relatively small end directed towards a localized heat source and a relatively large end directed towards a heat sink.

Alternatively, or in addition, heat spreading may occur in multiple directions that may include opposing directions. For example, heat generated from the active circuitry 867 within a lower layer of the main die 851 may be directed upward, towards a heat spreading system formed above the active circuitry 857. The heat may be further directed outward and/or laterally within one or more semiconductor layers, and downward towards a heatsink located below a substrate of the main die.

In at least some embodiments, a heat spreading system may spread heat from more than one localized region, such as an array of conductive contacts to an external die containing active circuitry and/or from a group of active circuitries 867 that may be adjacent and/or separated by non-thermal generating regions. It is further understood that a single semiconductor device, such as a single main die and/or a single configuration of a main die and a companion die, may include more than one different thermal spreading systems. The different systems may employ different heat spreading elements that may be configured to spread heat according to a common directivity and/or according to different directivities. In at least some embodiments, the different heat spreading elements may function largely independently, possibly spreading heat towards a common heat sink, and/or towards different heat sinks. Alternatively, or in addition, the different heat spreading elements may function in a tandem arrangement in which heat is spread from a localized region within a semiconductor device to an interim region within the semiconductor device, then from the interim region towards a heat sink that may be integrated into and/or thermally coupled to the semiconductor device.

The different thermal spreading systems may be fabricated from similar materials and/or different materials. In some embodiments, the different thermal spreading systems may conform to a common density requirement, such as an overall design density requirement for the semiconductor device. Alternatively, or in addition, the different thermal spreading systems may conform to different density requirements. In at least some embodiments utilizing different density requirements, neither density requirement may conform to an overall device density requirement, while a combination of the two different densities (e.g., over the entire semiconductor device and/or some subregion of the device) may conform to the overall device density requirement.

Figure 9:
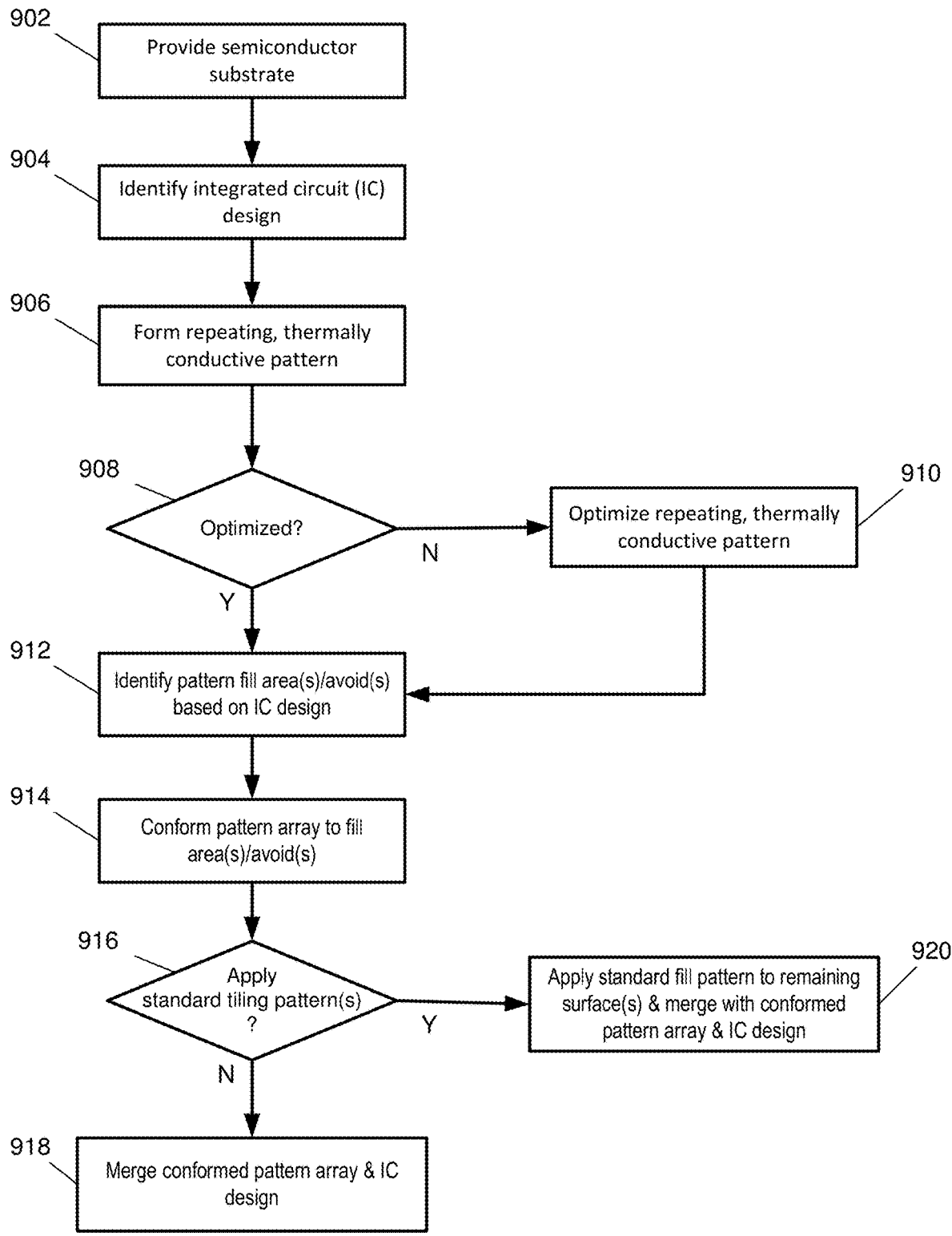
FIG. 9 depicts an illustrative embodiment of a semiconductor fabrication process that incorporates a patterned, multi-layer heat spreading system within a semiconductor device in accordance with various aspects described herein.

FIG. 9 depicts an illustrative embodiment of a semiconductor process 900 that incorporates designing, generating, forming and/or otherwise providing a patterned, multi-layer heat spreading system within a semiconductor device in accordance with various aspects described herein. Provide, at 902, a semiconductor layout.

An integrated circuit (IC) design may be identified, at 904. For example, an IC design may be prepared to perform one or more functions as may be required to accomplish a task (e.g., receiving, transmitting, and/or otherwise processing high-speed communication signals). The IC design may include one or more of a main die including active circuitry capable of generating heat. In at least some embodiments, the IC design may include a companion die capable of generating heat and coupled to a top surface of the main die (e.g., opposite a substrate layer of the main die to which a heat sink may be attached). It is understood that in at least some embodiments, heat generated by the active circuitry, whether intrinsic to the main die or from the companion die, should be directed to the substrate layer of the main die for dissipation therethrough (e.g., via a heatsink).

To this end, a repeating thermal spreading system including thermally conductive patterns may be designed and/or otherwise generated at 906. The thermal spreading system may include a spreading structure 200 as illustrated in FIG. 2A, which may include a cell pattern including a thermally conductive element and a thermally insulating region. The cell pattern may include one or more vias interconnecting other thermally conductive layers that may include cell patterns including thermally conductive elements and thermally insulating regions.

A determination may be made, at 908, as to whether the repeating, thermally conductive pattern is optimized. Optimization may be determined by modeling a thermal response of a particular design, comparing it to another design, and trending the design towards improved thermal performance. Alternatively, or in addition, optimization may be determined according to design constraints. At least some design constraints may relate to semiconductor fabrication (e.g., process constraints). By way of example, a fabrication process may establish a maximum ratio of metal to non-metal in a design layer. In this instance, the amount of metal may be maximized, to produce a layer at the fabrication limit.

To the extent it is determined at 908 that the repeating, thermally conductive pattern is not optimized, an optimization process may continue, at 910, until a determination is made that a thermal performance of the repeating, thermally conductive pattern is maximized. In at least some embodiments optimization may be concluded after some set number of design iterations. To the extent that it is determined at 908 that the repeating, thermally conductive pattern is optimized, or after having completed an optimization process of the repeating, thermally conductive pattern at 910, one or more thermally conductive, heat spreading pattern fill areas are identified at 912. The pattern fill area may be based at least in part on the IC design, which may dictate area(s) containing devices, such as waveguides, and/or avoid(s).

In at least some embodiments, the pattern array may be conformed, at 914, to any fill area(s) and/or avoid(s). Conforming the pattern array may include discretizing the pattern array and/or defining thermally conductive edge structures that may be thermally coupled to heat spreading elements of the pattern array.

In at least some embodiments, a determination is made, at 916, as to whether to apply any standard tiling pattern(s). The use of standard tiling may be dictated from a fabrication process, which may include cost and complexity considerations (e.g., limiting the use of thermally conductive heat spreading structures in areas where required and not otherwise).

To the extent that it is determined at 916 that the standard tiling pattern(s) should be applied, then apply the standard fill pattern, at 920, to remaining surface(s) and merge with conformed pattern array and IC design. To the extent it is determined at 916 that the standard tiling pattern(s) should not be applied, then merge, at 918, the conformed pattern array design and the IC design to obtain a merged design.

Figure 10:
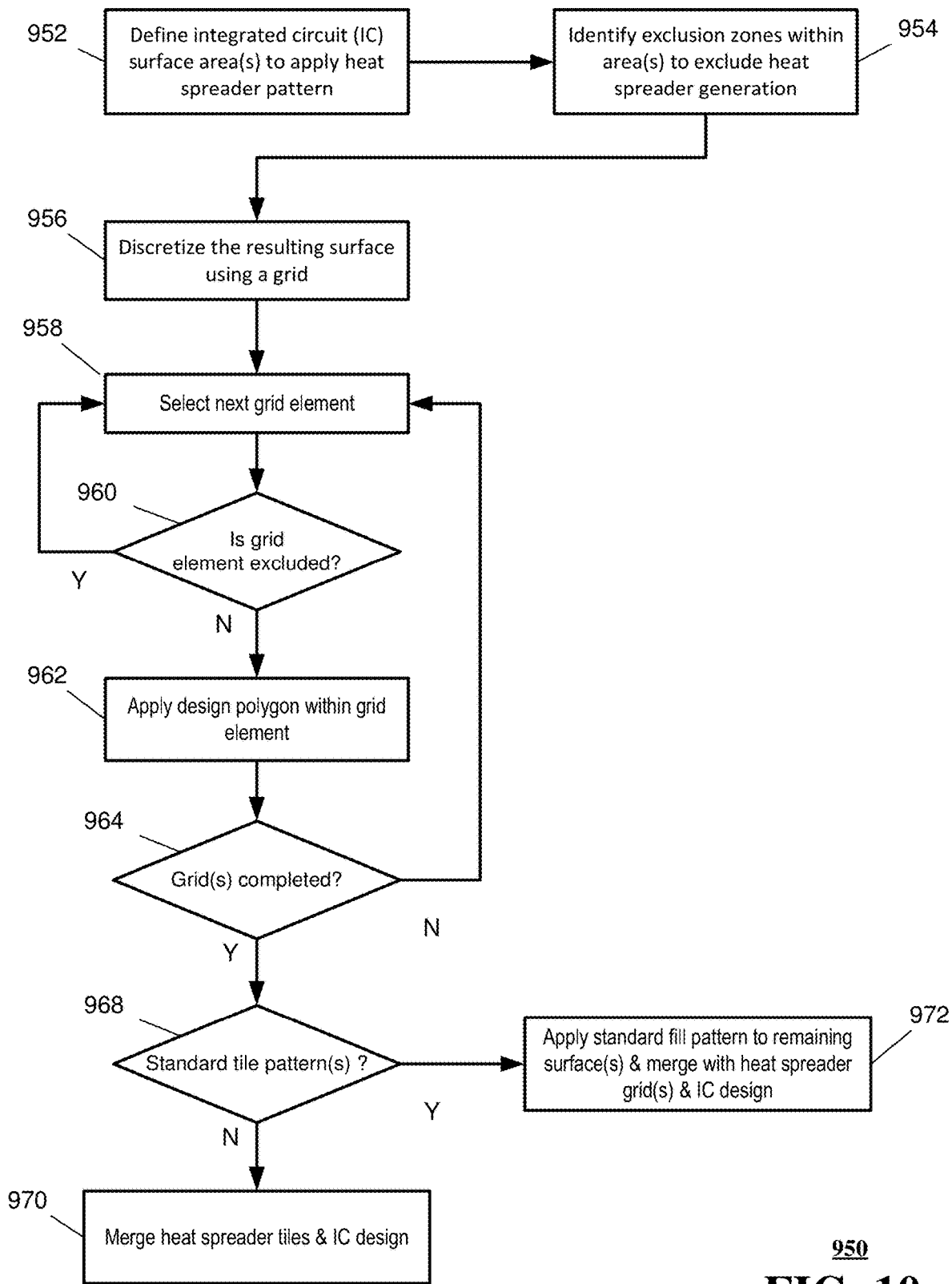
FIG. 10 depicts an illustrative embodiment of a semiconductor design process that incorporates a patterned, multi-layer heat spreading system within a semiconductor device in accordance with various aspects described herein.

FIG. 10 depicts an illustrative embodiment of a semiconductor design process 950 that incorporates a patterned, multi-layer heat spreading system within a semiconductor device in accordance with various aspects described herein.

One or more integrated circuit (IC) surface target area(s) may be defined, at 952, to which a heat spreader pattern should be applied. In some embodiments, target areas may include an entire surface area of an IC, while in other embodiments, the target areas may include a collection of one or more sub regions of the entire surface area. For example, if an IC contains active circuitry expected to generate a substantial amount of heat, then an area proximate to the active circuitry may be identified as a target area to be treated according to the various techniques disclosed herein, including the incorporation of a heat spreader pattern. In some embodiments, the active circuitry may be incorporated within the IC itself. Alternatively, or in addition, the active circuitry may be incorporated into a separate device, such as a surface mounted device and/or a companion die as may be mounted to the IC in a flip chip arrangement. In such instances, the target area may be identified as a region surrounding the external device and/or areas surrounding electrical and/or thermal couplings, such as conductive leads, solder balls, conductive bumps, and the like.

It is understood that an extent of a target area (e.g., a range, shape and/or surface area value may depend upon one or more factors). These factors may include, without limitation, an anticipated amount of heat or thermal load, a duration during which the thermal load is expected to persist, a duty cycle associated with the thermal load, during which the load value may increase and decrease according to an observed, expected and/or otherwise specified parameters. Other factors may include, without limitation, a semiconductor design (e.g., its material, thickness, a size and/or shape of the main die and/or any companion die). Still other considerations may include, without limitation, a configuration of the heat spreader pattern elements and/or array configuration. This may include coverage area, pattern element size, via arrangements, and so forth.

In at least some embodiments, one or more exclusion zones may be identified, at 954, within area(s) to which a heat spreader pattern should be applied. Such exclusion zones exclude heat spreaders within an identified exclusion region. Exclusion regions may be identified according to one or more other structures of a semiconductor device, such as locations, sizes, shapes and/or technologies of any circuits, devices, or other structures that may be adversely impacted by proximate includes of the heat spreader patter. For example, waveguides (e.g., optical waveguides), may be integrated within a semiconductor device. Depending upon waveguide design requirements (e.g., operating wavelengths and/or power levels), the dimensions of the waveguide may extend over multiple layers of an IC. Any structure, such as a metal via, encroaching upon the waveguide might negatively impact operation for its intended purpose. Accordingly, an exclusion zone may be defined according to boundaries of the waveguide. It is envisioned that in some embodiments, the exclusion zone may apply to some subset of available layers of a semiconductor device, such that some layers may include an exclusion zone, while others might not be determined by a device, such as the example waveguide.

It is further understood that in at least some embodiments, the exclusion zones may be determined according to electrical performance of an active element and/or other circuitry of the IC. For example, a semiconductor device may include transmission lines, antennas, and/or other regions dedicated to providing electrical power and/or electrical grounding. In such instances it may be advantageous to maintain a separation distance between the heat spreader pattern and any such devices and/or circuits. The exclusion zones may be as simple as a notch and/or a void that separates power from ground. Alternatively, or in addition, the exclusion zones may be identified with respect to operational characteristics. For example, physical and/or electrical separation between a structure and a heat spreader pattern may require a particular minimum distance be observed and/or that a particular range of distances be observed (e.g., providing symmetrical separation about a structure, such as a transmission line and/or an antenna). Such distances might also depend upon electrical loading characteristics, such as capacitance and/or inductance.

The resulting surfaces to which a heat spreader pattern should be applied (e.g., excluding any voids, may be discretized, at 956, using a grid pattern). In at least some embodiments, the grid pattern may be determined by a grid of an array corresponding to the repeated array of the heat spreader patterns. Alternatively, or in addition, the grid pattern may include a grid spacing, size, and/or shape that corresponds to a thermal spreading element of the heat spreader pattern.

In some embodiments, the discretizing is applied to multiple layers of the semiconductor device. It is understood that in such multi-layer configurations, the discretization may occur according to the same grid. Namely, the same grid pattern may be used to discretize different layers. In at least some embodiments, the same grid pattern may be applied in a manner to align with an application of the grid pattern of another layer. Alternatively, or in addition, a different grid pattern may be used for different regions of the same layer and/or to discretize the target surfaces of different layers of the semiconductor device.

The discretization may be applied on a per-element basis, such that a next grid element may be selected at 958, until the entire target area has been discretized. In at least some embodiments, a selection of the next grid pattern element may be sequential (e.g., row by row, column by column, or according to some predetermined sequence).

Having selected a grid element at 958, a determination may be made, at 960, as to whether the grid element should be excluded. This determination may depend upon an overlaying of the grid pattern to a pattern (e.g., boundary(ies) of the target area and any exclusion zone(s) as might be included therein). It is understood that this process may be repeated in a layer-by-layer manner (e.g., to determine a design or map of each layer as might be provide to a semiconductor fabrication facility).

To the extent it is determined at 960 that the grid element is excluded, the grid is excluded from the heat spreader pattern and the process may return to select, at 958, a next grid element. The process may be repeated until a target area has been covered and/or until some other region of the semiconductor device has been covered up to and including the entire surface area.

To the extent it is determined at 960 that the grid element is not excluded, a heat spreader pattern design (e.g., a polygon, may be applied, included, provided and/or otherwise associated, at 964, within grid element). An application of the heat spreader pattern design to each grid element may provide some or all a particular heat spreader pattern as applied to a particular target region.

It is understood that in at least some embodiments, grid tiles covered by a target area, but not included in the discretization process, may be identified as grid cells to which a border region may be provided. Such border regions may include thermally conductive material (e.g., metal, over that portion of a border grid cell covered by the target area). The thermally conductive material may be thermally coupled to heat-spreading elements provided in the discretized grid cells.

It is understood that in at least some embodiments, a non-functional pattern array may be applied to at least some layers of the semiconductor device. Such so called, standard tiling and/or dummy fill patterns, may be beneficial and/or otherwise required according to design fabrication rules (e.g., requiring each layer to have a prescribed ratio of metal to non-metal or insulator). Accordingly, a determination may be made, at 966, as to whether to application of any standard tiling pattern(s) may be necessary (e.g., for a design layer of a multi-layer IC design).

To the extent it is determined at 966 that the standard tiling pattern(s) should be applied, then an application of the standard fill pattern is incorporated and/or otherwise applied, at 972, to remaining surface(s). The resulting tiling pattern(s) may be merged with the heat spreader pattern (e.g., a conformed heat spreader pattern array and/or an IC design that may be associated with the particular layer(s) being designed).

To the extent it is determined at 966 that the standard tiling pattern(s) should not be applied, then the conformed pattern array design and the IC design may be merged, at 970, to obtain a merged design. The merged design(s) of one or more layers of the semiconductor device may be used to prepare masks and/or designs as may be employed during a fabrication process of the semiconductor device.

Figure 11:
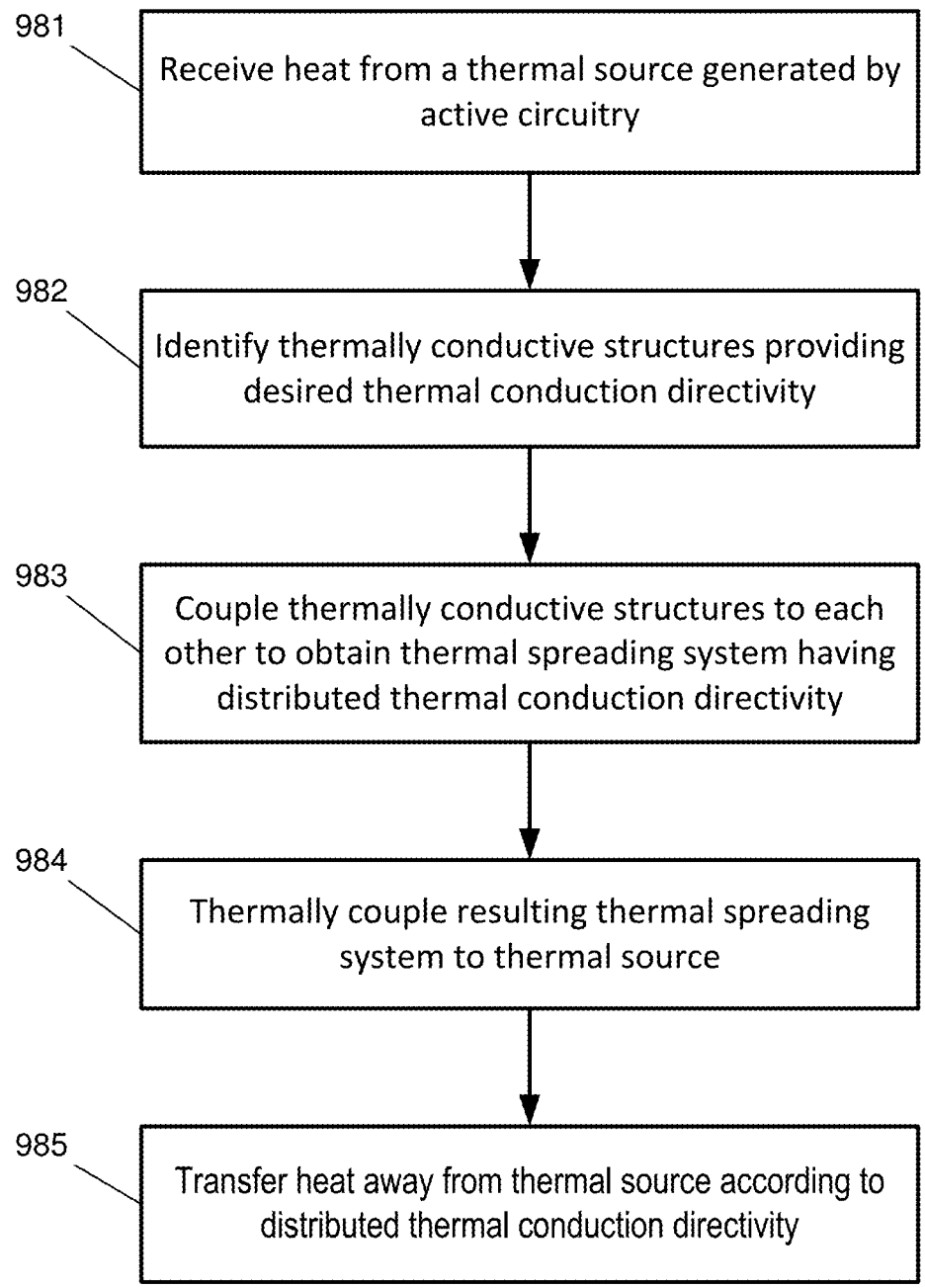
FIG. 11 depicts an illustrative embodiment of a heat transfer process that manages heat transfer within a semiconductor device in accordance with various aspects described herein.

FIG. 11 depicts an illustrative embodiment of a heat transfer process 980 that manages heat transfer within a semiconductor device in accordance with various aspects described herein.

Heat may be received, at 981, from a thermal source (e.g., generated by active circuitry). The active circuitry may include one or more regions integrated within and/or on a surface of a semiconductor device. Alternatively, or in addition, the active circuitry may include one or more external devices that may be thermally, electrically and/or mechanically attached to the semiconductor device, in which instance(s) the thermal source may be a thermal conduit into the semiconductor device. Examples of such conduits may include conductive bumps, solder pads, solder balls, conductive columns, make-and-break connections, and the like.

Thermally conductive structures may be identified, at 982, providing desired thermal conduction directivity. The thermal structure may include, without limitation, a thermally conducting layer region, a thermally insulating layer region, and one or more thermally conductive vias providing thermal conduits to thermally conducting layer regions of another semiconductor layer. The structures may incorporate a design shape (e.g., a polygon, distinguishing a thermally conductive region from a thermally insulating region within a predetermined grid cell as may be defined by another polygon, such as a square).

The thermally conductive structures may be coupled to each other, at 983, to obtain thermal spreading system having distributed thermal conduction directivity. For example, the directivity may extend within the plane in a preferred direction (e.g., north, or north and east). In at least some embodiments, the directivity may include all azimuthal directions within a layer. It is understood that the directivity may include further detail as to how the thermal energy should be conducted, possibly including a pattern that accentuates thermal directivity on one or more preferred directions, while diminishing and/or excluding thermal directivity in other directions.

Alternatively, or in addition, the thermal directivity may extend in one or more directions out of a design plane of the semiconductor device. For example, the directivity may extend in an upward direction, a downward direction, or both upward and downward directions. In at least some embodiments, the directivity may include a pattern that accentuates thermal directivity in one or more preferred directions (e.g., according to an elevation with respect to a design plane of the semiconductor device).

It is understood that in at least some embodiments, thermal conductivity should be configured to direct and/or otherwise transfer or channel heat from a localized source to a heat dissipating structure, such as a heat sink. By way of nonlimiting example, a semiconductor die may include a heatsink attached to a base or substrate layer. The heat source (e.g., the active circuitry), may be generated in one or more device layers constructed on top of the substrate layer. In such instances, it may be advantageous to apply a directivity that transfers heat to the substrate layer in an efficient, and preferably a most efficient manner. An efficient thermal transfer may include a relatively short and direct path. Alternatively, or in addition, an efficient thermal transfer may include a diversion through a relatively large thermally conductive area of a heat spreading pattern that contributes towards an ultimate channeling of the heat to the substrate layer.

In at least some embodiments, directivity may be established to conduct thermal energy towards a thermal sink, away from a thermal sink, and/or around one or more structures that may be included within the semiconductor device, such as waveguides.

A thermal spreading system may be thermally coupled, at 984, to the localized thermal source to facilitate a transfer of heat away from the thermal source to facilitate a transfer, at 985, of heat away from thermal source according to distributed thermal conduction directivity, preferably to a suitable heat sink, such as the semiconductor substrate layer and/or any external heat sink as may be coupled thereto.

While for purposes of simplicity of explanation, the respective processes are shown and described as a series of blocks in FIGS. 9-11, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

Moreover, it will be noted that the disclosed subject matter can be practiced with various computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be in both local and remote memory storage devices.

Further, the various embodiments can be implemented as a method, apparatus or article of manufacture using standard programming and/or engineering techniques to produce software, firmware, hardware, or any combination thereof to control a computer to implement the disclosed subject matter. The term "article of manufacture" as used herein is intended to encompass semiconductor devices, wafers, integrated circuits, circuit modules, modules, systems and/or components incorporating semiconductor devices, as well as a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to," "coupled to," and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature, or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all the features described with respect to an embodiment can also be utilized.

What is claimed is:

1. A method for fabricating a semiconductor device, comprising:
   providing a semiconductor substrate;
   forming first repeating, thermally conductive patterns, wherein at least a portion of the first repeating, thermally conductive patterns are configured for coupling to active circuitry, and wherein each first repeating, thermally conductive pattern comprises:
      a plurality of thermally conductive layers, wherein a first thermally conductive layer of the plurality of thermally conductive layers is thermally coupled to a thermal source generated by the active circuitry; and
      a plurality of thermally conductive vias interconnecting the plurality of thermally conductive layers, wherein a combination of the thermally conductive vias, and the plurality of thermally conductive layers is configured to spread a transfer of heat from the thermal source across an area of the thermally conductive layers and through the thermally conductive vias,
   wherein the first repeating, thermally conductive patterns are thermally coupled to each other, thereby spreading the transfer of heat through each of the first repeating, thermally conductive patterns, and
   wherein the spreading results in a distributed directionality of the heat from the thermal source to a second thermally conductive layer of the plurality of thermally conductive layers, thereby reducing a localized concentration of the heat.

2. The method of claim 1, wherein the plurality of thermally conductive layers is electrically conductive.

3. The method of claim 1, wherein the thermal source comprises a plurality of thermal sources.

4. The method of claim 3, further comprising:
   providing a companion die comprising the active circuitry,
   wherein the companion die is mechanically coupled to the semiconductor device via a plurality of conductive surface contacts, and
   wherein the plurality of thermal sources comprises the plurality of conductive surface contacts.

5. The method of claim 1, wherein at least a portion of the active circuitry is included in the semiconductor device.

6. The method of claim 1, wherein at least a portion of the first repeating, thermally conductive patterns are arranged within a first area of the semiconductor device according to a first grid pattern.

7. The method of claim 6, wherein the first area defines a boundary with a second area of the semiconductor device devoid of the first repeating, thermally conductive patterns.

8. The method of claim 6, wherein the first repeating, thermally conductive patterns is modified into a subset of the first repeating, thermally conductive patterns, forming a second repeating, thermally conductive patterns arranged within a third area located within the first area, wherein the first and second repeating, thermally conductive patterns adapt conformally, by conformal contouring, to a boundary formed by the first and third areas.

9. The method of claim 1, wherein the thermally conductive patterns have a metal region and an insulating region, and wherein a ratio of the metal region and the insulating region is configured according to a semiconductor fabrication process design constraint that limits an amount of metal.

10. A semiconductor device, comprising:
    a first semiconductor die comprising:
       a semiconductor substrate; and
       a thermal spreading system configured for coupling to a thermal source generated by active circuitry, wherein the thermal spreading system comprises:
          a first plurality of thermally conductive patterns, each thermally conductive pattern of the first plurality of thermally conductive patterns comprising:
             a plurality of thermally conductive layers, wherein a first thermally conductive layer of the plurality of thermally conductive layers is thermally coupled to the thermal source; and
             a plurality of thermally conductive vias interconnecting the plurality of thermally conductive layers, wherein a combination of the thermally conductive vias, the plurality of thermally conductive layers is configured to spread a transfer of heat away from the thermal source across an area of the thermally conductive layers and through the thermally conductive vias, wherein the first plurality of thermally conductive patterns is thermally coupled to each other, thereby spreading the transfer of heat through each of the thermally conductive patterns resulting in a distributed directionality of the heat from the thermal source to a second thermally conductive layer of the plurality of thermally conductive layers that avoids a localized concentration of the heat.

11. The semiconductor device of claim 10, wherein the thermally conductive patterns comprise surface areas, each having a metal region and an insulating region.

12. The semiconductor device of claim 11, wherein a ratio of the metal region and the insulating region is configured according to a semiconductor fabrication process design constraint that limits an amount of metal.

13. The semiconductor device of claim 11, wherein the active circuitry is contained within the first semiconductor die.

14. The semiconductor device of claim 11, further comprising a second semiconductor die electrically coupled to the first semiconductor die, wherein the active circuitry is contained within the second semiconductor die.

15. The semiconductor device of claim 11, further comprising:
a buried oxide layer positioned within the first semiconductor die, between the first plurality of thermally conductive patterns and the semiconductor substrate; and
a heatsink thermally coupled to the semiconductor substrate, wherein the distributed directionality transfers at least a portion of the heat towards the heatsink.

16. The semiconductor device of claim 11, further comprising:
a first region of the first semiconductor die, defining a boundary with a second region, wherein the first plurality of thermally conductive patterns is distributed within the first region and excluded within the second region.

17. The semiconductor device of claim 11, further comprising:
a third region of the first semiconductor die comprising a second plurality of thermally conductive patterns, adapting conformally to a shared boundary with the first plurality of thermally conductive patterns.

18. A method, comprising:
receiving from a thermal source, heat generated by active circuitry;
coupling a thermal spreading system to the thermal source, wherein the thermal spreading system is positioned within a semiconductor die, wherein the thermal spreading system comprises:
a plurality of thermally conductive structures, each thermally conductive structure of the plurality of thermally conductive structures comprising:
a plurality of thermally conductive layers, wherein a first thermally conductive structure of the plurality of thermally conductive layers is thermally coupled to the thermal source; and
a thermally conductive via interconnecting the plurality of thermally conductive layers, wherein a combination of the thermally conductive via and the plurality of thermally conductive layers transfers the heat away from the thermal source across an area of the thermally conductive structures and through the thermally conductive via;
thermally coupling the plurality of thermally conductive structures to each other to obtain a thermally coupled structure;
generating, by the thermally coupled structure, a spreading of the transfer of the heat across each of the thermally conductive structures; and
transferring the heat from the thermal source to a second thermally conductive structure of the plurality of thermally conductive structures to avoid a localized concentration of the heat.

19. The method of claim 18, wherein the active circuitry is positioned on a companion die coupled to the semiconductor die via a conductive member.

20. The method of claim 18, further comprising: reducing, by the spreading, the transfer of the heat to a region of the semiconductor die.

* * * * *